(12) United States Patent
Yamauchi

(10) Patent No.: US 6,493,264 B2
(45) Date of Patent: Dec. 10, 2002

(54) NONVOLATILE SEMICONDUCTOR MEMORY, METHOD OF READING FROM AND WRITING TO THE SAME AND METHOD OF MANUFACTURING THE SAME

(75) Inventor: Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/789,816

(22) Filed: Feb. 22, 2001

(65) Prior Publication Data

US 2001/0036107 A1 Nov. 1, 2001

(30) Foreign Application Priority Data

Mar. 30, 2000 (JP) ........................................ 2000-094339

(51) Int. Cl.[7] .............................................. G11C 16/04
(52) U.S. Cl. ............................ 365/185.18; 365/185.28; 365/185.29; 257/315; 257/316; 257/326
(58) Field of Search ....................... 365/185.18, 185.28, 365/185.29, 185.01; 257/316, 326, 315

(56) References Cited

U.S. PATENT DOCUMENTS

| 5,422,504 A | 6/1995 | Chang et al. |
| 5,641,989 A | 6/1997 | Tomioka |
| 5,793,079 A | 8/1998 | Georgescu et al. |
| 5,814,543 A | 9/1998 | Nishimoto et al. |
| 6,002,152 A | * 12/1999 | Guterman et al. .......... 257/316 |

FOREIGN PATENT DOCUMENTS

| EP | 0 936 672 A2 | 8/1999 |
| JP | 5-152579 | 6/1993 |

* cited by examiner

Primary Examiner—Hoai Ho
(74) Attorney, Agent, or Firm—Nixon & Vanderhye P.C.

(57) ABSTRACT

A nonvolatile semiconductor memory including at least two cells each comprising: a floating gate formed on a semiconductor substrate with the intervention of a first insulating film; a split gate formed on the semiconductor substrate with the intervention of a second insulating film at a predetermined distance from the floating gate; a control gate formed at least on the floating gate with the intervention of a third insulating film; and an impurity diffusion layer formed in a surface layer of the semiconductor substrate and capacitively coupled with an edge of the floating gate on an opposite side to the split gate in the channel direction, wherein the floating gate and the split gate of one cell are alternately arranged with the floating gate and the split gate of another adjacent cell along the channel direction and the impurity diffusion layer of one cell is capacitively coupled with a split gate of another adjacent cell.

45 Claims, 24 Drawing Sheets

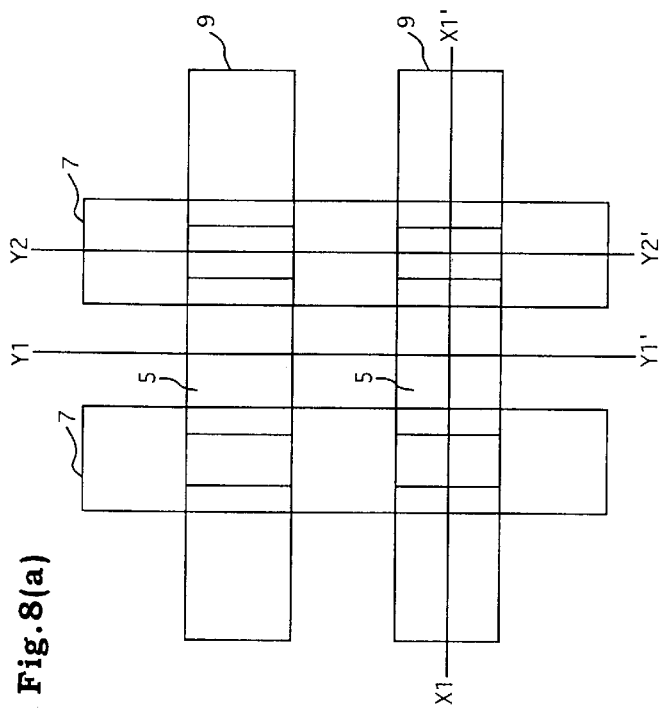
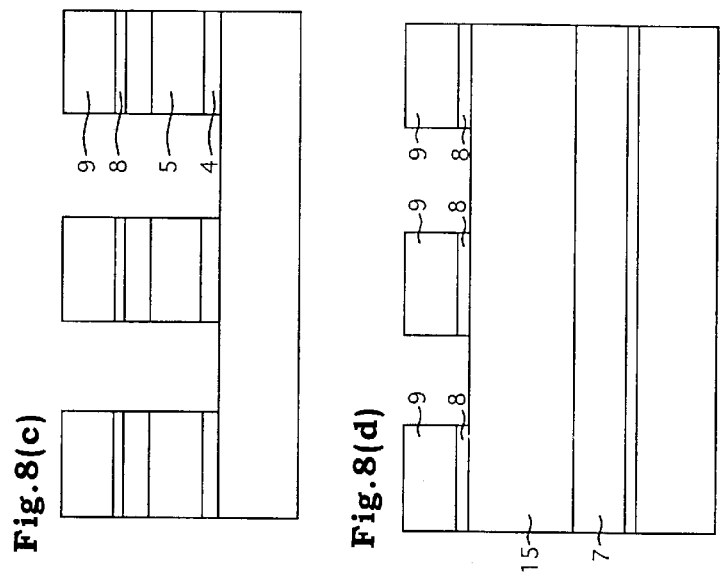
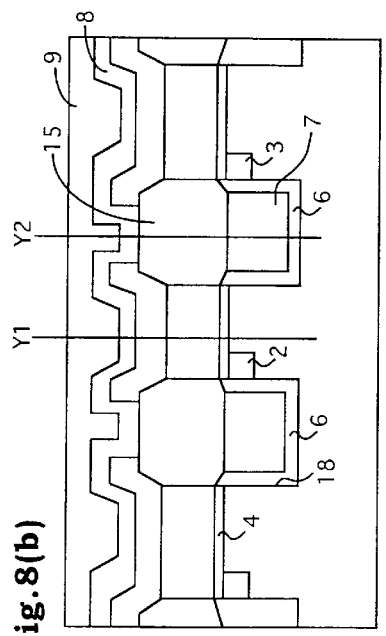
Fig.8(a) Fig.8(b) Fig.8(c) Fig.8(d)

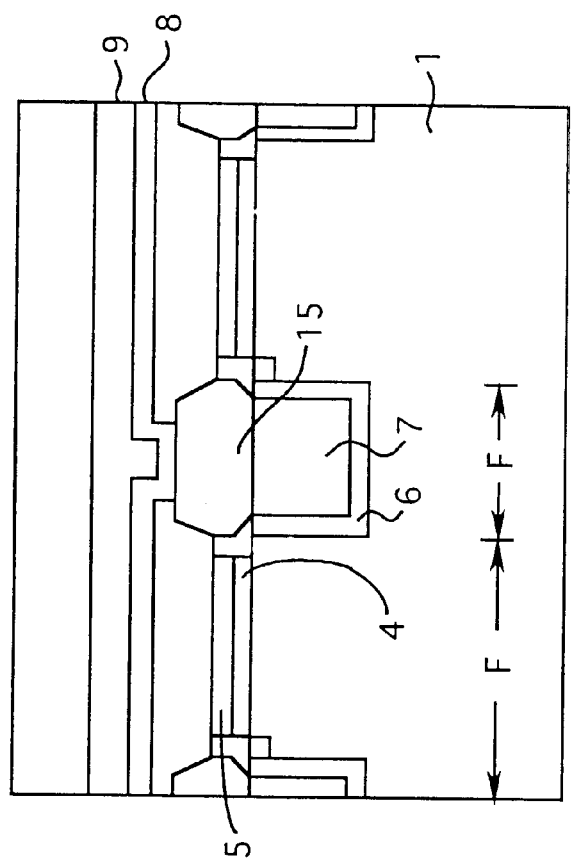

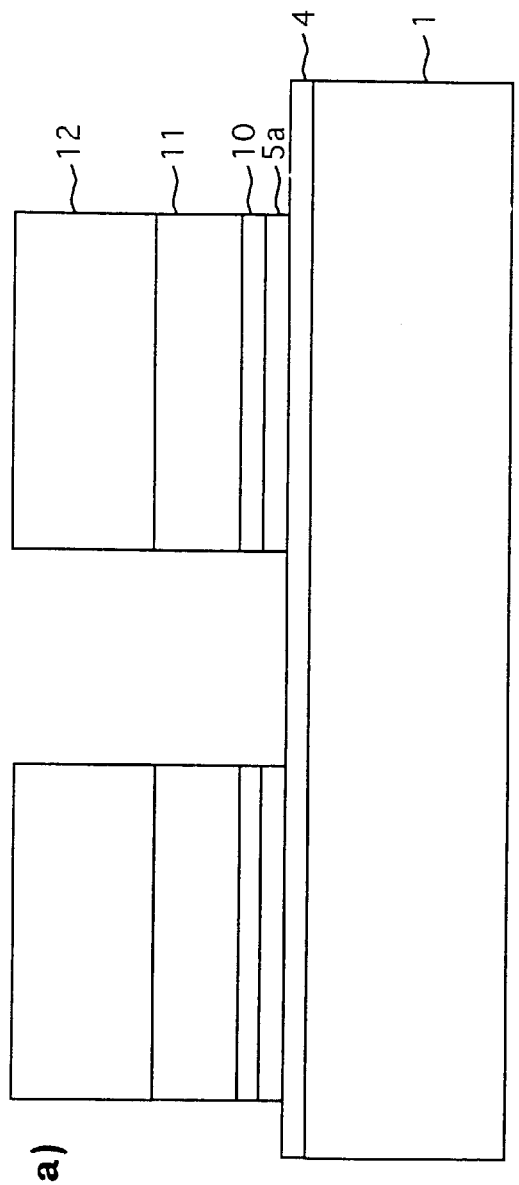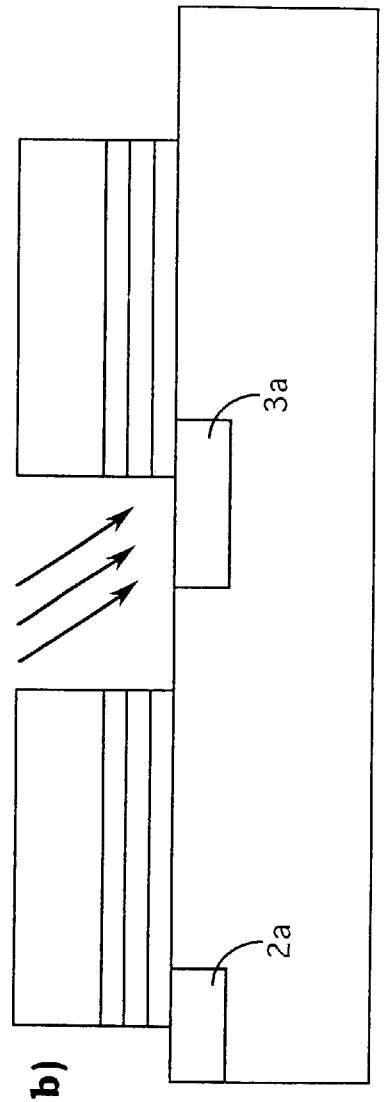

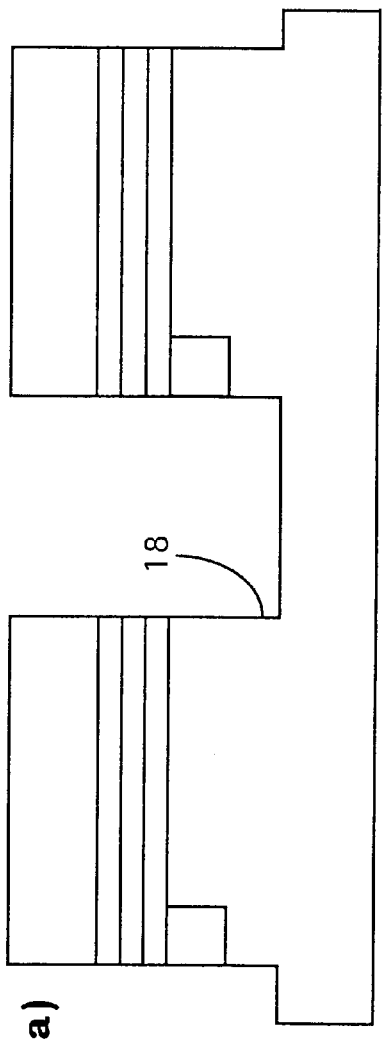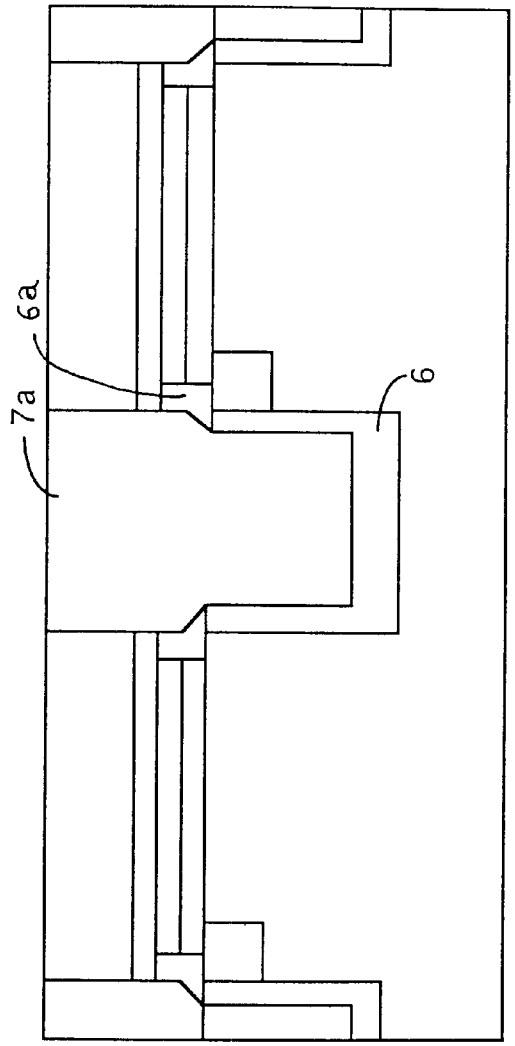
Fig.11(a)
Fig.11(b)

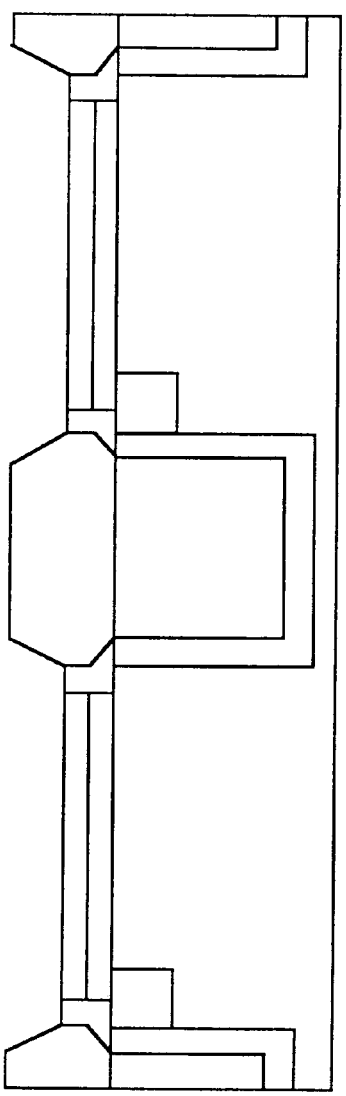
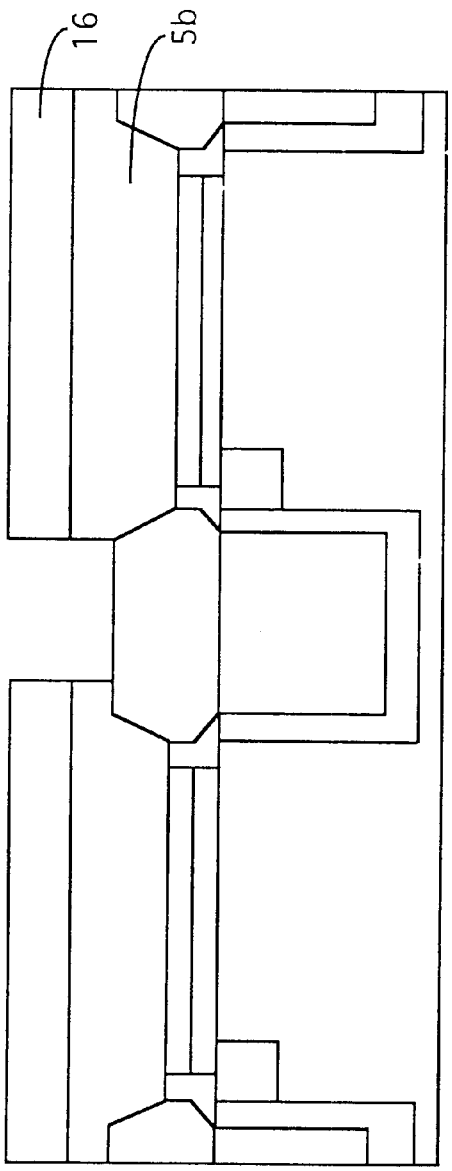
Fig.13(a)
Fig.13(b)

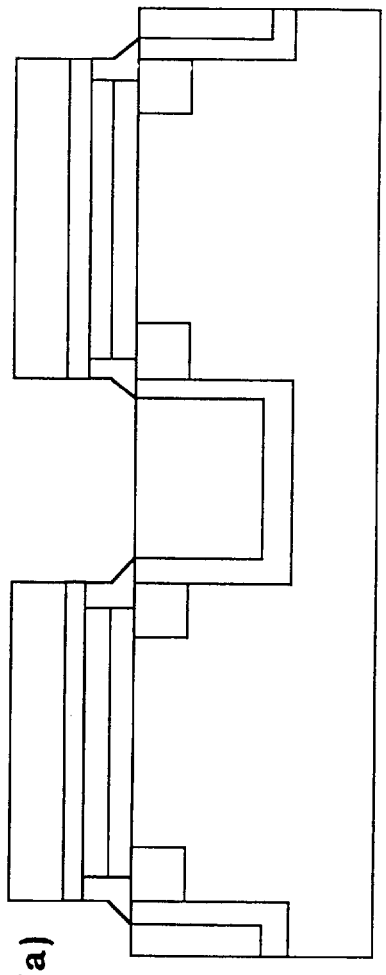
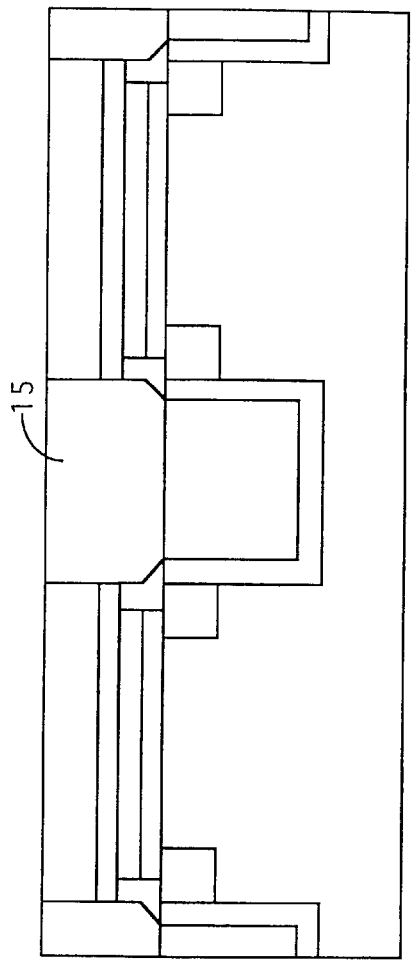
Fig.20(a)
Fig.20(b)

(A-A' sectional view)

(B-B' sectional view)

NONVOLATILE SEMICONDUCTOR MEMORY, METHOD OF READING FROM AND WRITING TO THE SAME AND METHOD OF MANUFACTURING THE SAME

CROSS-REFERENCE TO RELATED APPLICATION

This application is related to Japanese application No. 2000-94339 filed on Mar. 30, 2000, whose priority is claimed under 35 USC § 119, the disclosure of which is incorporated by reference in its entirety.

BACKGROUND OF THE INVENTION

1. Field of the Invention

The present invention relates to a nonvolatile semiconductor memory, a method of reading from and writing to the same, and a method of manufacturing the same. More particularly, it relates to a nonvolatile semiconductor memory having cells of split gate (SPG) structure and being capable of high integration, a method of reading from and writing to the same, and a method of manufacturing the same.

2. Description of Related Art

Virtual grounding structure has been proposed with a view to reducing the size of memory cells in a nonvolatile semiconductor memory,. In the virtual grounding structure, one bit line can be omitted, because a bit line does not need to contact an impurity diffusion layer which functions as a drain, and a source of a cell can serve as a drain of another cell adjacent to the cell so that one bit line can be omitted. Therefore, scaling of the cells is easily performed and an area of the cells can be minimized in NOR structures. Thus, the virtual grounding structure is suited to realize large capacity. An example of a conventional virtual grounding structure is described in Japanese Unexamined Patent Publication No. HEI 6 (1994)-196711. Now referring to FIG. 22, the conventional technique is explained.

In FIG. 22, a buried bit line 51 in a semiconductor substrate 50 of the first conductivity type is asymmetrically constituted of a low concentration impurity diffusion layer 52 of the second conductivity type and a high concentration impurity diffusion layer 53 of the second conductivity type. The impurity diffusion layer 52 overlaps with a floating gate 54a of an adjacent memory cell and the impurity diffusion layer 53 overlaps with a floating gate 54b of another adjacent memory cell. That is, the buried bit line 51 serves as a source of a cell and a drain of a cell adjacent to the cell.

However, in the above-mentioned virtual grounding structure, it is known that data reading from a cell is often interfered by a cell adjacent to the cell. Accordingly, it has been difficult to achieve satisfactory reading precision and to obtain a multi-valued circuit.

Regarding this drawback, a virtual grounding structure with SPG cells has been known (Japanese Unexamined Patent Publication No. HEI 5 (1993)-152579). Specifically, as shown in FIG. 23, floating gates 62a and 62b are provided as sidewall spacers on the sidewalls of a SPG 61 in the channel direction, respectively and a control gate 63 is provided along the channel direction. Further, an impurity diffusion layer 65a which is capacitively coupled with the floating gate 62a and an impurity diffusion layer 65b which is capacitively coupled with the floating gate 62b and the SPG 61 are formed in a surface layer of a semiconductor substrate 64. The impurity diffusion layer 65b is also coupled capacitively with the floating gate 62a of an adjacent cell.

Various methods of rewriting the memory cells have been known, for example, a method of injecting electrons from the substrate to the floating gate or from the floating gate to the drain with use of Fowler-Nordheim (FN) tunnel current, and a method of injecting electrons from the source to the floating gate or from the drain to the floating gate with use of channel hot electrons (CHE). In the memory cell constituted as shown in FIG. 23, rewriting is not performed by the method of injecting the electrons from the floating gate to the drain with use of the FN tunnel current since the floating gates are formed on both sidewalls of the SPG. Therefore, the applicable range of the memory cell of such a construction is limited.

Further, if the memory is more miniaturized and the gate is formed shorter, dielectric strength between the source and the drain is reduced and writing errors are resulted. Accordingly the reduction of the cell area is difficult.

FIG. 24(a) is a plan view for illustrating the difficulty in reducing the cell area by the conventional technique described above. FIGS. 24(b) and 24(c) are cross-sections cut along the lines A-A' and B-B' shown in FIG. 24(a), respectively. In FIGS. 24(a) to 24(c), reference numeral 71 signifies a diffused bit line, 72 a low concentration impurity diffusion layer, 73 a high concentration impurity diffusion layer, 74 a floating gate, and 75 a control gate. FIG. 24(b) is a cross section in the direction parallel to the control gate and FIG. 24(c) is a cross section in the direction vertical to the control gate.

When the nonvolatile semiconductor memory shown FIG. 24(a) to 24(c) is formed, provided that the minimum manufacturing order of the nonvolatile semiconductor memory is F (e.g., if the manufacture is under 0.15 μm process, F=0.15 μm), the size of the memory cell in the direction parallel to the control gate will be Lg (channel length between the source and the drain)+F (bit line width).

In this memory cell, when a common writing voltage is applied to an adjacent bit line, the value Lg of about 0.3 μm is required to ensure dielectric strength between the source and the drain. That is, when the minimum manufacturing order F is 0.15 μm, Lg=2F is established. As a result, the size of the memory cell in the X direction (horizontal to the control gate) will be 3F. The size in the Y direction (vertical to the control gate) will be 2F, which is the sum of the size F of a portion where the floating gate and the control gate overlaps with each other and the size F of a portion between the memory cells.

Thus, the memory cell area in the virtual grounding structure according to the prior art is $6F^2$. The actual minimum area $4F^2$ is difficult to realize by the prior art technique.

Also in the structure shown in FIG. 23, an additional transistor (a SPG transistor) is required between the source and the drain, so that the area occupied by the transistor has been an obstacle to the scaling.

Since such a SPG region inevitably exists as long as the SPG cells are employed, the cell area of $4F^2$, which is the actual minimum value, is difficult to realize as in the previously mentioned structure.

SUMMARY OF THE INVENTION

According to the present invention, provided is a nonvolatile semiconductor memory including at least two cells each comprising:

a floating gate formed on a semiconductor substrate with the intervention of a first insulating film;

a split gate (SPG) formed on the semiconductor substrate with the intervention of a second insulating film at a predetermined distance from the floating gate;

a control gate formed at least on the floating gate with the intervention of a third insulating film; and an impurity diffusion layer formed in a surface layer of the semiconductor substrate and capacitively coupled with an edge of the floating gate on an opposite side to the SPG in the channel direction, wherein the floating gate and the SPG of one cell are alternately arranged with the floating gate and the SPG of another adjacent cell along the channel direction and the impurity diffusion layer of one cell is capacitively coupled with a SPG of another adjacent cell.

The present invention further provides a method of reading data from the above-described nonvolatile semiconductor memory, wherein the data reading from one cell is performed by grounding the impurity diffusion layer of said one cell and applying a voltage to an impurity diffusion layer of another adjacent cell, or by applying a voltage to the impurity diffusion layer of said one cell and grounding the impurity diffusion layer of said another adjacent cell.

Still further, according to the present invention, provided is a method of reading data from the above-described nonvolatile semiconductor memory, wherein the data reading from one cell is performed by applying a voltage to the SPG of said one cell and avoiding voltage application to a SPG of another adjacent cell to isolate said one cell from said another adjacent cell.

Still further, according to the present invention, provided is a method of writing/erasing data to/from the above-described nonvolatile semiconductor memory, wherein the data writing/erasing is performed by utilizing FN tunnel current flowing between the floating gate and the semiconductor substrate or the floating gate and the impurity diffusion layer of one cell.

Still further, according to the present invention, provided is a method of writing data to the above-described nonvolatile semiconductor memory, wherein the data writing to one cell is performed by applying a predetermined voltage to the impurity diffusion layer of said one cell and grounding an impurity diffusion layer of another cell to flow electric current, and applying a first voltage to the SPG to weakly invert a channel region facing the SPG to inject hot electrons from an edge of the SPG.

Still further, according to the present invention, provided is a method of data writing to the above-described nonvolatile semiconductor memory, wherein the data writing to one cell is performed by applying a predetermined voltage to the impurity diffusion layer of said one cell and grounding an impurity diffusion layer of another cell to flow electric current, and applying a second voltage to the SPG to strongly invert a channel region facing the SPG to inject hot electrons from the impurity diffusion layer of said one cell.

Still further, according to the present invention, provided is a method of manufacturing a nonvolatile semiconductor memory comprising the steps of:

(a1) forming at least two floating gates for providing at least two cells on a semiconductor substrate with the intervention of a first insulating film to have a predetermined distance therebetween in a channel direction;

(b1) forming two SPGs on the semiconductor substrate with the intervention of a second insulating film at one side of each of the floating gates along the channel direction;

(c1) forming an impurity diffusion layer in a surface layer of the semiconductor substrate between the floating gate of one cell and the SPG of another adjacent cell so that the impurity diffusion layer is capacitively coupled with the floating gate of said one cell and the SPG of said another adjacent cell; and (d1) forming a control gate on each of the floating gates with the intervention of a third insulating film.

Still further, according to the present invention, provided is a method of manufacturing a nonvolatile semiconductor memory comprising the steps of:

(a2) forming at least two floating gates for providing at least two cells on a semiconductor substrate with the intervention of a first insulating film to have a predetermined distance therebetween in a channel direction;

(b2) performing oblique ion implantation of impurities using the floating gates as a mask or using a mask formed on the floating gates to form an impurity diffusion layer in a surface layer of the semiconductor substrate at one side of each of the floating gates;

(c2) forming two trenches in the semiconductor substrate including a part of the impurity diffusion layer using the floating gates as a mask or using a mask formed on the floating gates;

(d2) forming a second insulating film on the sidewalls and the bottom of the trenches;

(e2) forming two SPGs by burying a conductive material in the trenches; and (f2) forming a control gate on each of the floating gates with the intervention of a third insulating film.

Still further, according to the present invention, provided is a method of manufacturing a nonvolatile semiconductor memory comprising the steps of:

(a2) forming at least two floating gates for providing at least two cells on a semiconductor substrate with the intervention of a first insulating film to have a predetermined distance therebetween in a channel direction;

(b2) performing oblique ion implantation of impurities using the floating gates as a mask or using a mask formed on the floating gates to form an impurity diffusion layer in a surface layer of the semiconductor substrate at one side of each of the floating gates;

(c2)' forming sidewall spacers on sidewalls of each of the floating gates and forming two trenches in the semiconductor substrate including a part of the impurity diffusion layer using the floating gates and the sidewall spacers as a mask;

(d2) forming a second insulating film on the sidewalls and the bottom of the trenches;

(e2) forming two split gates by burying a conductive material in the trenches; and (f2) forming a control gate on each of the floating gates with the intervention of a third insulating film.

Still further, according to the present invention, provided is a method of manufacturing a nonvolatile semiconductor memory comprising the steps of:

(a2) forming at least two floating gates for providing at least two cells on a semiconductor substrate with the intervention of a first insulating film to have a predetermined distance therebetween in a channel direction;

(b2)" performing ion implantation of impurities at least to regions between the floating gates using the floating gates as a mask or using a mask formed on the floating gates and annealing;

(c2)" forming sidewall spacers on sidewalls of each of the floating gates and forming two trenches using the floating gates and the sidewall spacers as a mask to provide a floating impurity diffusion layer and an impurity diffusion layer in a surface layer of the semiconductor substrate under each of the sidewall spacers;

(d2) forming a second insulating film on the sidewalls and the bottom of the trenches;

(e2) forming two SPGs by burying a conductive material in the trenches; and (f2) forming a control gate on each of the floating gates with the intervention of a third insulating film.

Still further, according to the present invention, provided is a method of manufacturing a nonvolatile semiconductor memory comprising the steps of:

(a2) forming at least two floating gates for providing at least two cells on a semiconductor substrate with the intervention of a first insulating film to have a predetermined distance therebetween in a channel direction;

(b2)" performing ion implantation of impurities at least to regions between the floating gates using the floating gates as a mask or using a mask formed on the floating gates and annealing;

(c2)'" forming two trenches at least between the floating gates to provide a floating impurity diffusion layer and an impurity diffusion layer below edge portions of the floating gates extending along the sides of the trench, respectively;

(d2) forming a second insulating film on the sidewalls and the bottom of the trenches;

(e2) forming two SPGs by burying a conductive material in the trenches; and (f2) forming a control gate on each of the floating gates with the intervention of a third insulating film.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 8(a) is a schematic plan view and

FIGS. 8(b) to 8(d) are sectional views of a memory cell of a nonvolatile semiconductor memory according to Embodiment 3 of the present invention;

FIG. 9 is a schematic view illustrating an area of the memory cell of FIG. 8;

FIGS. 10(a) and 10(b) are schematic sectional views illustrating the manufacturing steps of the memory cell according to Embodiment 3;

FIGS. 11(a) and 11(b) are schematic sectional views illustrating the manufacturing steps of the memory cell according to Embodiment 3;

FIGS. 13(a) and 13(b) are schematic sectional views illustrating the manufacturing steps of the memory cell according to Embodiment 3;

FIGS. 20(a) and 20(b) are schematic sectional views illustrating the manufacturing steps of the memory cell according to Embodiment 8;

DESCRIPTION OF THE PREFERRED EMBODIMENTS

According to the present invention as described above, methods utilizing the FN tunnel current and the CHE for data writing are used in a nonvolatile semiconductor memory of virtual grounding structure provided with the SPG cells. Thus, a highly reliable nonvolatile semiconductor memory capable of high-speed writing is provided.

Further, since the SPG transistor comprising the SPG and the impurity diffusion layer is buried in the trench, the memory cell area of $4F^2$, which is the actual minimum value, is achieved without any influence from the structure of the SPG, and thus a nonvolatile semiconductor memory of large capacity is provided.

Hereinafter, the present invention will be explained in further detail, but the invention is not limited thereto.

Embodiment 1

Figure 1:
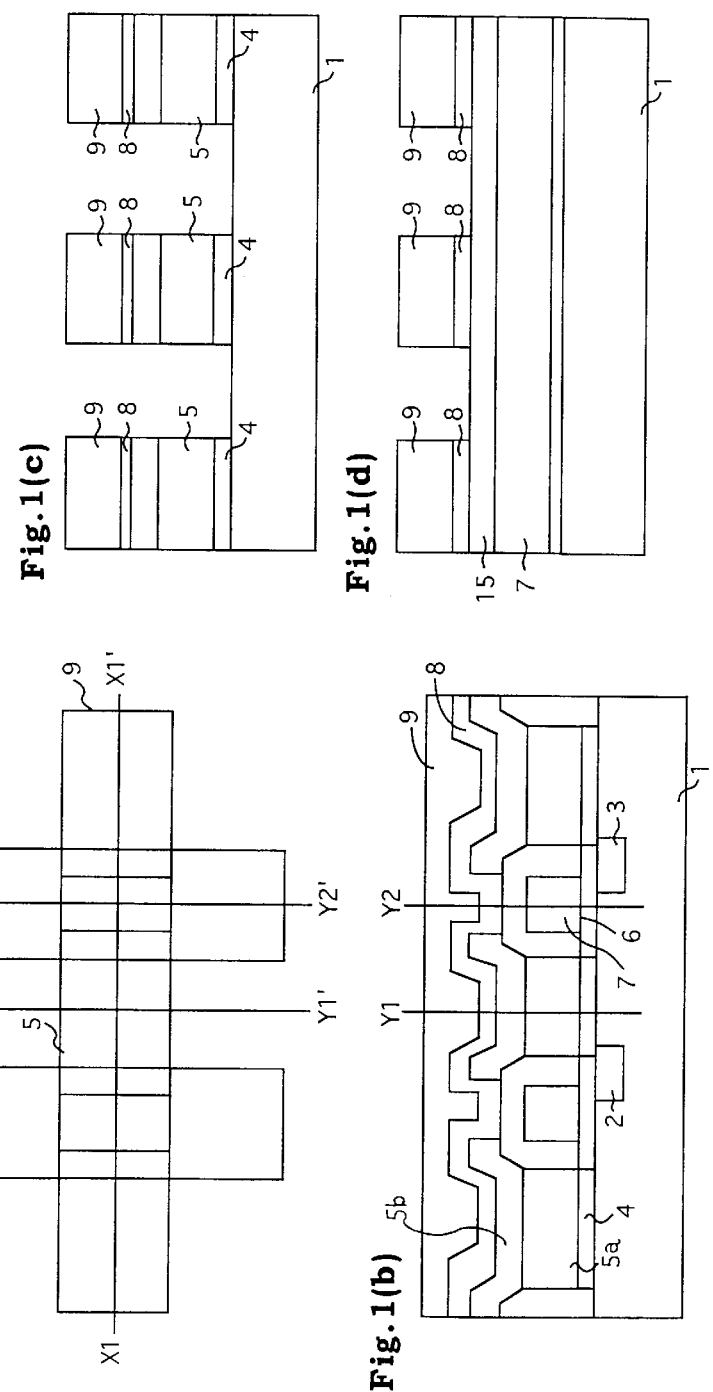
FIG. 1(a) is a schematic plan view and FIGS. 1(b) to 1(d) are sectional views of a memory cell of a nonvolatile semiconductor memory according to Embodiment 1 of the present invention.
Figure 2:
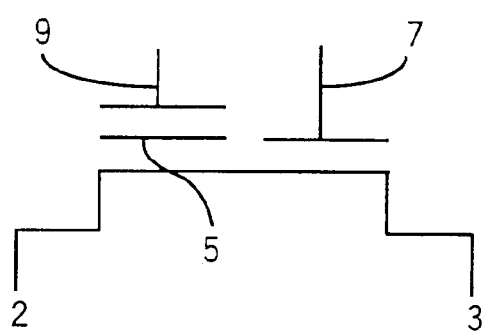
FIG. 2 is an equivalent circuit diagram of the memory cell of FIG. 1.

FIG. 1(a) is a schematic plan view illustrating an example of a memory cell of the nonvolatile semiconductor memory according to the present invention. FIGS. 1(b) to 1(d) are sectional views, among which FIG. 1(b) is cut along a plane X1-X1' (parallel to the channel direction), FIG. 1(c) is cut along a plane Y1-Y1' (vertical to the channel direction) and FIG. 1(d) is cut along a plane Y2-Y2' (vertical to the channel direction). FIG. 2 is an equivalent circuit diagram of the memory cell of FIG. 1(a).

In FIGS. 1(a) to 1(d), the memory cell of the nonvolatile semiconductor memory comprises $N^+$-type impurity diffusion layers 2 and 3 formed in a surface layer of a semiconductor substrate 1 of P-type silicon. On the semiconductor substrate 1 between the impurity diffusion layers 2 and 3, a floating gate 5 of polysilicon is formed with the intervention of a tunnel oxide film (a first insulating film) 4 and a SPG 7 of polysilicon is formed with the intervention of a gate oxide film of $SiO_2$ (a second insulating film) 6. A control gate 9 is provided on the floating gate with the intervention of an ONO film 8 (a third insulating film).

The first, second and third insulating films may be an oxide film, a nitride film or a layered structure of these films. The above-mentioned conductivity types of the semiconductor substrate and the impurity diffusion layer may be replaced. The memory cell itself may be formed in a well.

The impurity diffusion layer 2 functions as a source in a cell and a drain in another cell adjacent to the cell. The tunnel oxide film may be 3 to 10 nm thick (e.g., 9 nm) and the gate oxide film may be 5 to 30 nm thick (e.g., 20 nm).

Hereinafter, a method of manufacturing the memory cell of the nonvolatile semiconductor memory of FIG. 1(a) is described with reference to FIGS. 3(a) to 4(d).

First, a tunnel oxide film 4 is formed by thermal oxidization on a semiconductor substrate 1 of a first conductivity type. Then, a polysilicon layer 5a of 10–200 nm thick (e.g., 50 nm), an oxide film 10 of 5–50 nm thick (e.g., 20 nm) and a nitride film 11 of 10–500 nm thick (e.g., 200 nm) are formed in this order over the tunnel oxide film 4. A resist mask 12 is provided thereon and desired portions of the nitride film 11, the oxide film 10, the polysilicon layer 5a and the tunnel oxide film 4 are etched away (see FIG. 3(a)).

After the resist mask 12 is removed, thermal oxidization is performed at 600–1100° C. to form sidewall spacers 13 of a silicon oxide film on the sidewalls of the polysilicon layer 5a. A polysilicon layer 7a for forming the SPG is deposited between the sidewall spacers 13 and then planarization is performed by etch back until the nitride film 11 is exposed (see FIG. 3(b)). The nitride film 11 serves as an etch stopper.

Then, a resist mask 14 is formed to have an opening over a sidewall spacer 13 between the polysilicon film 7a of a cell and the polysilicon layer 5a of another cell adjacent thereto along the channel direction. Using the resist mask 14 as a mask, the sidewall spacer 13 is removed to expose the semiconductor substrate 1. Then, ion implantation with As, for example, is performed to form impurity diffusion layers 2 and 3 in the surface layer of the semiconductor substrate (see FIG. 3(c)). The ion implantation is carried out under an accelerating voltage of 5–30 kev (e.g., 15 kev) and an implantation amount of $1 \times 10^{13}$ to $1 \times 10^{16}$ $cm^{-2}$ (e.g., $1 \times 10^{14}$ $cm^{-2}$).

After the resist mask 14 is removed, a thermal treatment is performed at 600–1100° C. (e.g., 800° C.) to form a silicon oxide film (an insulating film) 15 on the polysilicon layer 7a and in a portion from which the sidewall spacer 13 was removed in the previous step (see FIG. 4(a)). The thermal treatment revives the crystallinity of the implanted region and activates the implanted impurities. Further, the polysilicon layer 7a turns to be a SPG 7.

Figure 4A:
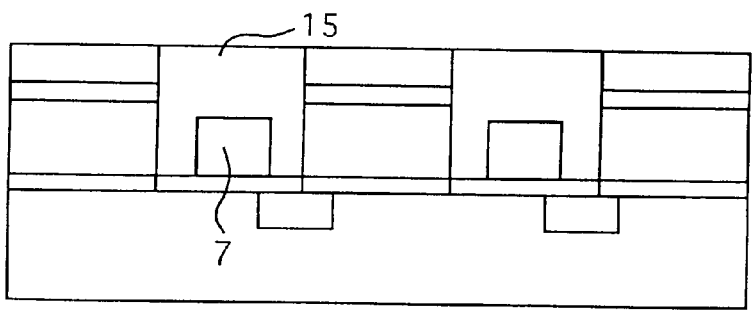
FIGS. 4(a) to 4(d) are schematic sectional views illustrating the manufacturing steps of the memory cell of FIG. 1.
Figure 4B:
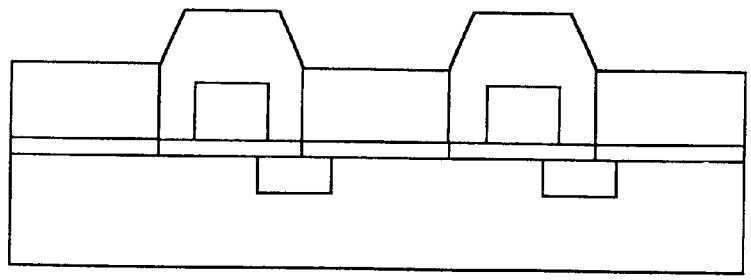

Then, the nitride film 11 and the oxide film 10 are sequentially etched away (see FIG. 4(b)). The edges of the insulating film 15 is slightly etched and rounded through the etching step, which is favorable for the reduction of level difference.

Figure 4C:
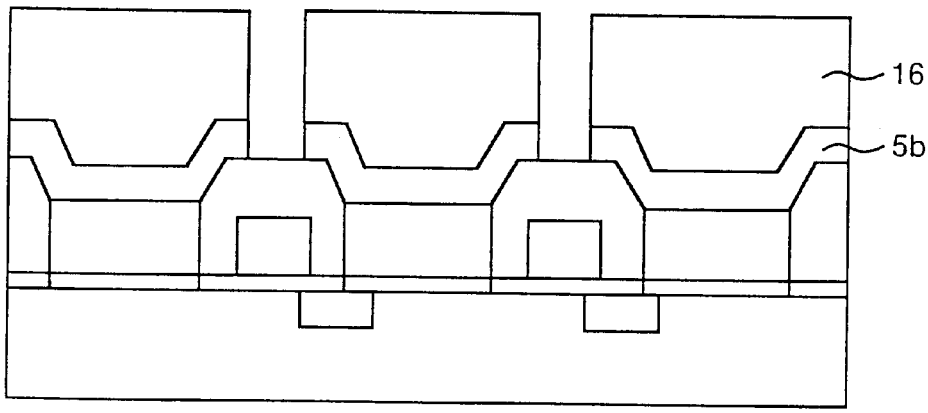
Figure 4D:
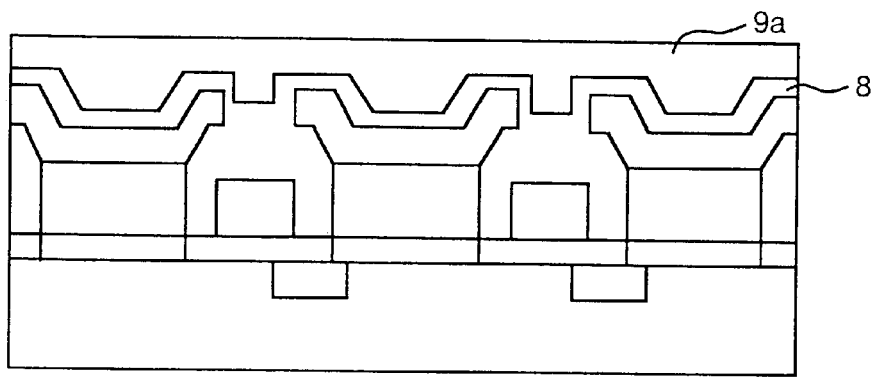

Next, a polysilicon layer 5b is deposited to a thickness of 40–400 nm (e.g., 100 nm) and patterned using a resist mask 16 (see FIG. 4(c)). This step increases an overlapping area between the floating gate and the control gate. As a result, gate capacitance coupling ratio increases and voltage consumption is lowered. This embodiment employs the polysilicon layer 5b for the above reason, but it may be omitted.

Then, the resist mask 16 is removed. A third insulating film made of an ONO film 8 and a polysilicon layer 9a are deposited and then patterning is performed for forming word lines. Accordingly, the polysilicon layers 5a, 5b and 9a and the ONO film 8 are sequentially etched to form a floating gate and a control gate in self-alignment (FIG. 4(d)).

Finally, a protective film such as BPSG (Boron Phosphorus Silicate Glass) is deposited (not shown).

Through these steps, the nonvolatile semiconductor memory of the present invention is completed.

Next, reading and writing in the memory cell itself are described with reference to FIG. 5, Tables 1 and 2. In the Tables, CG signifies the control gate and FG signifies the floating gate.

TABLE 1

| Reading | Structure | CG | SPG | Drain | Source | Substrate |
|---------|-----------|----|----|-------|--------|-----------|
| READ 1 | Source | 3V | 3V | 0 | 1V | 0 |
| READ 2 | Drain | 3V | 3V | 1V | 0 | 0 |

TABLE 2

| Writing/ Erasing | | Structure | CG | SPG | Drain | Source | Substrate |
|---|---|---|---|---|---|---|---|
| WRITE 1 | FN | FG-substrate | 20 V | 0 | 0 | 0 | 0 |
| WRITE 2 | FN | FG-substrate | −20 V | 0 | 0 | 0 | 0 |
| WRITE 3 | FN | FG-drain | −12 V | 0 | 4 V | 0 | 0 |
| WRITE 4 | CHE | Source | 12 V | 2 V | 4 V | 0 | 0 |
| WRITE 5 | CHE | Drain | 12 V | 12 V | 6 V | 0 | 0 |

Tables 1 and 2 indicate writing and rewriting, respectively. These operations can be performed in different modes. The modes are described below.

1) Reading

As shown in READ 1 of Table 1, when a sense voltage of 3V is applied to the control gate while the drain is grounded, a voltage of 1V is applied to the source, a voltage of 3V is applied to the SPG and the substrate is grounded, the reading of the memory cell is performed, i.e., the memory cell is OFF when a threshold value of the control gate transistor is 3V or more and is ON when the threshold voltage is 3V or less.

Further, as shown in READ 2 of Table 1, the reading is also carried out even if the voltages to be applied to the drain and the source are replaced.

2) Rewriting

In the memory cell of the present invention, data storing is carrier out by changing a threshold voltage of the transistor through injecting or extracting electrons in and out of the floating gate. In the mechanism of data rewriting in this memory cell, the FN tunnel current and the CHE are also applicable.

First, the rewriting with use of the FN tunnel current is described.

2-1) Between the Floating Gate and the Substrate

In this mode, as shown in WRITE 1 in Table 2, the drain and the substrate are grounded and a positive high voltage (20V) is applied to the control gate. Then, the channel region (substrate surface) below the floating gate holds the same electric potential as the drain voltage (ground potential), and a high electric field of about 10 MV/cm is applied between the floating gate and the substrate. Then, electrons are injected from the substrate to the floating gate. On the other hand, since a voltage of 0V is applied to the source, the injection of electrons to the floating gate is not carried out. As a result, the threshold voltage of the control gate transistor including the control gate, the floating gate and the impurity diffusion layer increases only in a selected memory cell. At this time, the SPG is grounded for preventing writing errors to adjacent cells.

Further, as shown in WRITE 2 in Table 2, the drain, source and the substrate are grounded and a negative high voltage (−20V) is applied to the control gate. Then, a high electric field of about 10 MV/cm is applied between the floating gate and the substrate, electrons are injected from the floating gate to the substrate and the threshold voltage of the control gate transistor decreases.

2-2) Between the Floating Gate and the Drain

In this mode, as shown in WRITE 3 in Table 2, a voltage of 4V is applied to the drain, the source and the substrate are grounded and a negative high voltage (−12V) is applied to the control gate. Then, a high electric field of about 10 MV/cm is applied between the floating gate and the drain, electrons are injected from the floating gate to the drain and the threshold voltage of the control gate transistor decreases. At this time, the SPG is grounded for preventing erroneous writing to adjacent cells.

Next, a rewriting operation using CHE is described.

2-3) Between the Source and the Floating Gate

As indicated in WRITE 4 in Table 2, a voltage of 4V is applied to the drain, the substrate and the source are grounded, a positive high voltage (12V) is applied to the control gate and then a voltage (2V) close to its threshold voltage is applied to the SPG to make the channel region under the SPG weakly inverted. As a result, a high electric field is generated at the source of the control gate transistor, hot electrons are injected from the source to the floating gate, and then the threshold voltage of the control gate transistor increases.

2-4) Between the Drain and the Floating Gate

As indicated in WRITE 5 in Table 2, a voltage of 6V is applied to the drain, the substrate and the source are grounded, a positive high voltage (12V) is applied to the control gate and a voltage (8V) considerably higher than its threshold voltage is applied to the SPG. As a result, a high electric field is generated at the drain of the control gate transistor, hot electrons are injected from the drain to the floating gate, and then the threshold voltage of the control gate transistor increases.

The above-described operation modes have the following features.

For example, the writing/erasing carried out by combining the above-mentioned WRITE 1 and WRITE 2 is referred to as a bipolarity writing/erasing system, which is highly reliable. With WRITE 3, low voltage consumption is achieved. Further, data writing at ultra high speed is performed with WRITE 4. WRITE 5 is the most popular operation system and a conventional technique is applicable.

Thus, required device performance of various kinds are satisfied by one device, which enlarges the applicable range of the device.

Hereinafter, operations of the memory cells in array configuration are described.

Figure 5:
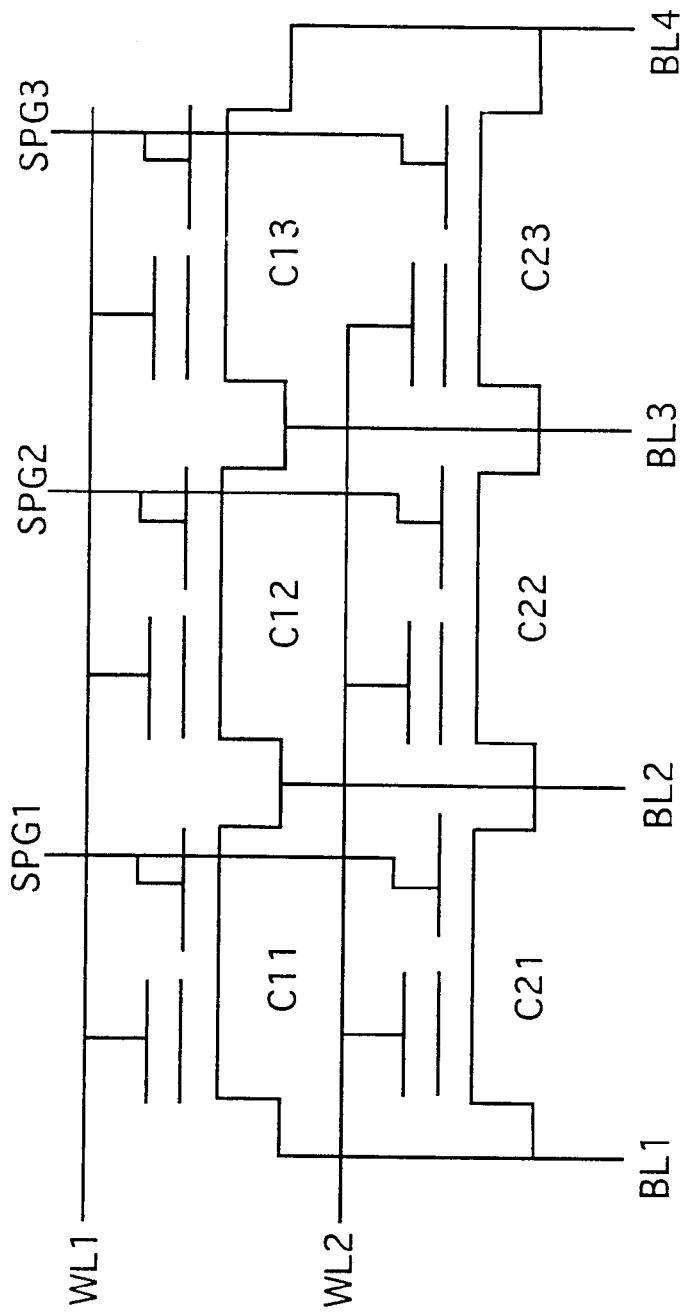
FIG. 5 is an equivalent circuit diagram of the memory cell of FIG. 1 constructed in 3×2 bit array.

FIG. 5 shows the memory cells of this embodiment arranged in 3×2 bit array. The array is comprised of 6 cells of C11 to C23. The cell C12 is the selected cell. Such an array pattern is problematic in erroneous reading and writing caused by the adjacent cells. Biasing conditions of the selected cell and the unselected cells are described below. Tables 3 and 4 indicate reading and rewriting conditions, respectively.

TABLE 3

| Reading | Structure | WL1 | WL2 | SPG1 | SPG2 | SPG3 | BL1 | BL2 | BL3 | BL4 | Substrate |
|---|---|---|---|---|---|---|---|---|---|---|---|
| READ 1 | Source | 3 V | 0 | 0 | 3 V | 0 | 0 | 0 | 1 V | 0 | 0 |
| READ 2 | Drain | 3 V | 0 | 0 | 3 V | 0 | 0 | 1 V | 0 | 0 | 0 |

TABLE 4

| Writing/Erasing | | Structure | WL1 | WL2 | SPG1 | SPG2 | SPG3 | BL1 | BL2 | BL3 | BL4 | Substrate |
|---|---|---|---|---|---|---|---|---|---|---|---|---|
| WRITE 1 | FN | FG-Substrate | 20 V | 0 | 0 | 0 | 0 | 6 V | 0 | 6 V | 6 V | 0 |
| WRITE 2 | FN | FG-Substrate | −20 V | 0 | 0 | 0 | 0 | 0 | 0 | 0 | 0 | 0 |
| WRITE 3 | FN | FG-Drain | −12 V | 0 | 0 | 0 | 0 | 0 | 4 V | 0 | 0 | 0 |
| WRITE 4 | CHE | Source | 12 V | 0 | 0 | 2 V | 0 | 0 | 4 V | 0 | 0 | 0 |
| WRITE 5 | CHE | Drain | 12 V | 0 | 0 | 8 V | 0 | 0 | 6 V | 0 | 0 | 0 |

3) Erroneous Reading Caused by Adjacent Cells

Biasing conditions for the selected cell (C12) and the adjacent unselected cells (C11, C13, C22) are shown in Table 3. As indicated in READ 1 in Table 3, the unselected cell (C22) connected to a word line WL2 will not influence the selected cell (C12) by grounding the word line WL2. Erroneous reading of the unselected cells (C11 and C13) connected to a word line WL1 is avoided by grounding SPG 1 and SPG 3.

Further, as indicated in READ 2 in Table 3, similar reading can be carried out and the erroneous reading is prevented even if voltages applied to a BL2 and a BL3 are replaced.

4) Erroneous Writing to Adjacent Cells (FN Tunneling Mode)

4-1) Between the Floating Gate and the Substrate

Biasing conditions for the selected cell (C12) and the adjacent unselected cells (C11, C13, C22) are shown in Table 4. As shown in WRITE 1 (electron injection from the substrate to the floating gate) in Table 4, erroneous writing to the unselected cell (C22) connected to the word line WL2 is avoided by grounding the word line WL2. With respect to the unselected cells (C11 and C13), the SPG 1, SPG 2 and SPG 3 are grounded to turn all SPG transistors OFF, the BL2 is grounded and a positive voltage (6V) is applied to the BL1, BL3 and BL4. Thus, the tunnel electric field in the drain regions of the unselected cells (C11 and C13) is alleviated and the electron injection to the floating gates of the unselected cells is prevented. In this way, the erroneous writing is avoided by the bias voltage application.

Further, as indicated in WRITE 2 (electron injection from the floating gate to the substrate) of Table 4, the erroneous writing to the unselected cell (C22) is prevented by grounding the WL2. However, since the unselected cells (C11 and C13) shares the same word line WL1, electron extraction from the floating gate to the substrate occurs in all cells connected to the same word line. To such cells, only batch erasing is applicable.

4-2) Between the Floating Gate and the Drain

As shown in WRITE 3 (electron injection from the floating gate to the drain) in Table 4, erroneous writing to the unselected cell (C22) is prevented by grounding the WL2. With respect to the unselected cells (C11 and C13) connected to the word line WL1, the SPG 1, SPG 2 and SPG 3 are grounded to turn the SPG transistors OFF, a voltage of 4V is applied to the BL2, and then the BL1, BL3 and BL4 are grounded. Thus, the tunnel electric field in the drain regions of the unselected cells (C11 and C13) is alleviated and the electron injection to the floating gates of the unselected cells is prevented. In this way, the erroneous writing is prevented. In this case, the erasing can be performed by bit unit.

4-3) Between the Source and the Floating Gate (CHE Mode)

As indicated in WRITE 4 (electron injection from the source to the floating gate) in Table 4, the erroneous writing to the unselected cell (C22) is prevented by grounding the WL 2.

Further, with respect to the unselected cells (C11 and C13) connected to the word line WL1, a voltage of 2V is applied to the SPG 2, and the SPG 1 and the SPG 3 are grounded to turn the SPG transistors of the cells C11 and C13 OFF. Thus, the current flowing between the source and the drain is hindered and the electron injection to the floating gates of the unselected cells is prevented. Through the bias voltage application, the erroneous writing is avoided.

4-4) Between the Drain and the Floating Gate (CHE Mode)

As indicated in WRITE 5 (electron injection from the drain to the floating gate) in Table 4, the erroneous writing to the unselected cell (C22) is prevented by grounding the WL2.

Further, with respect to the unselected cells (C11 and C13) connected to the word line WL1, a voltage of 8V is applied to the SPG 2, and then the SPG 1 and the SPG 3 are grounded to turn the SPG transistors of the unselected cells C11 and C13 OFF. Then, the current flowing between the source and the drain is hindered and the electron injection to the floating gates of the unselected cells is prevented. In this bias voltage application, the erroneous writing is avoided.

Embodiment 2

A method of manufacturing the nonvolatile semiconductor memory of FIG. 1(a) which is further provided with a floating impurity diffusion layer will be explained with reference to FIGS. 6(a) to 7(d).

Figure 3A:
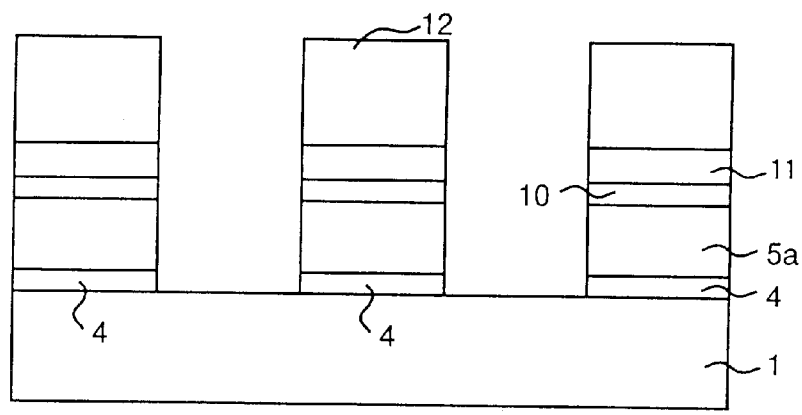
FIGS. 3(a) to 3(c) are schematic sectional views illustrating the manufacturing steps of the memory cell of FIG. 1.
Figure 3B:
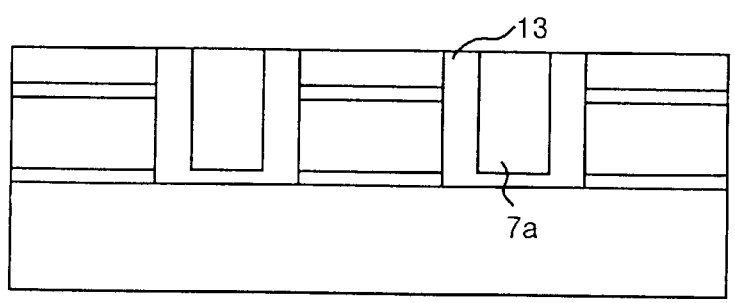
Figure 3C:
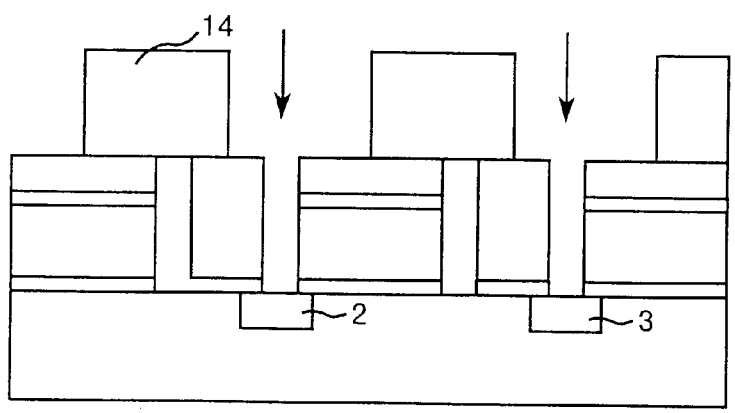
Figure 6A:
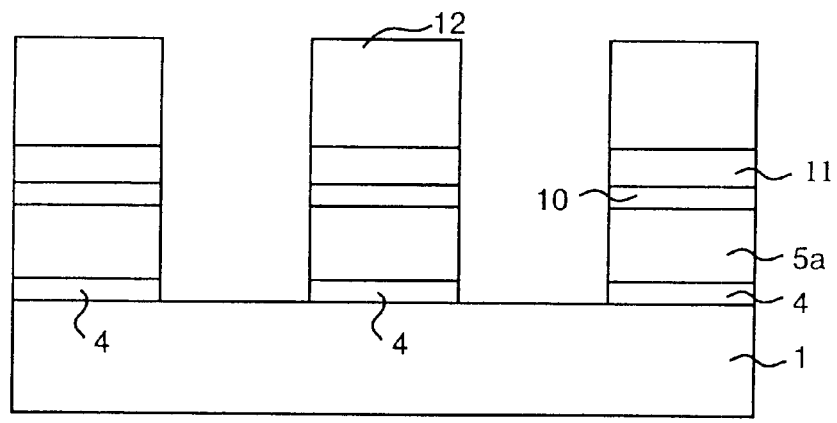
FIGS. 6(a) to 6(c) are schematic sectional views illustrating the manufacturing steps of a memory cell according to Embodiment 2 of the present invention.
Figure 6B:
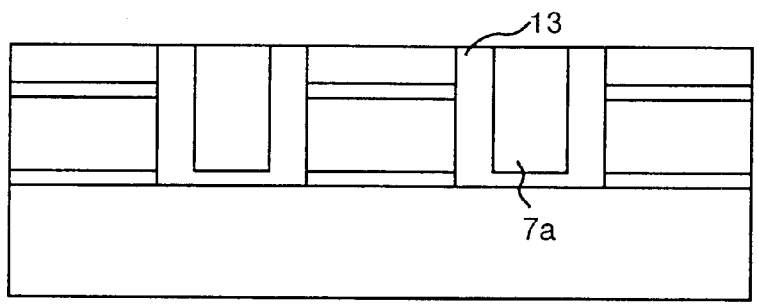
Figure 6C:
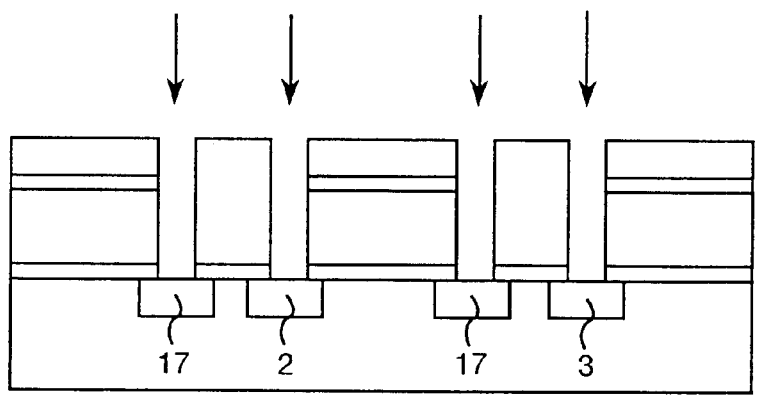
Figure 7A:
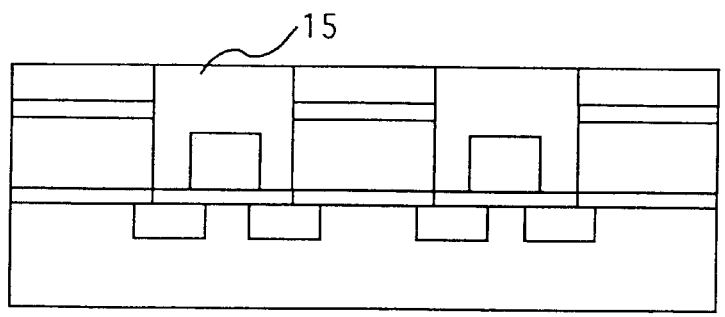
FIGS. 7(a) to 7(d) are schematic sectional views illustrating the manufacturing steps the memory cell according to Embodiment 2 of the present invention.
Figure 7B:
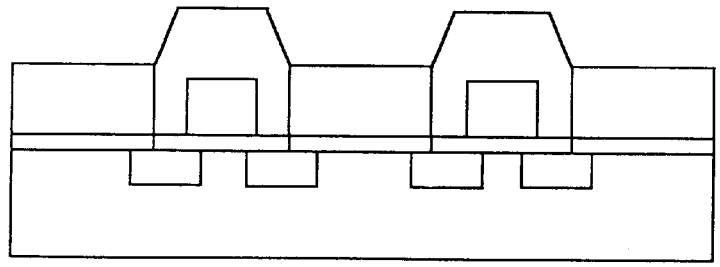
Figure 7C:
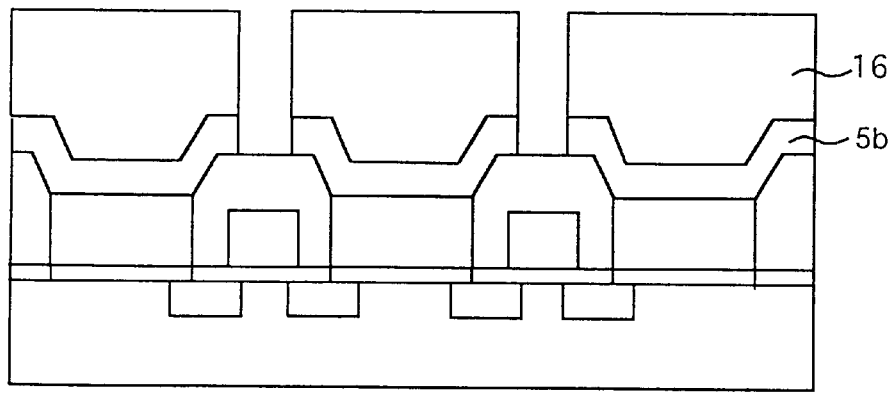
Figure 7D:
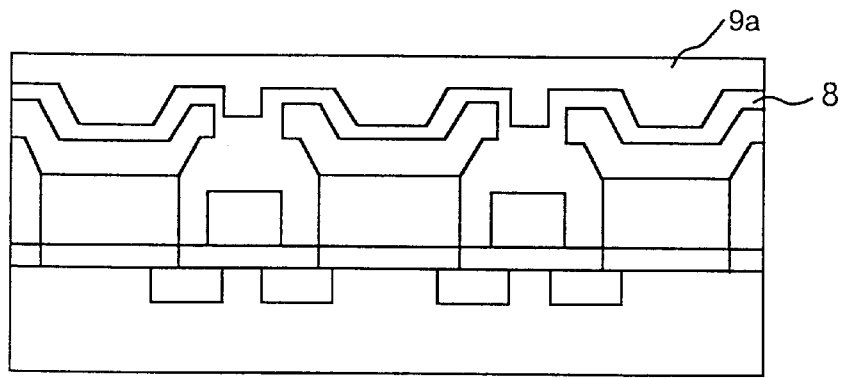

First, the same manufacturing steps as illustrated in FIGS. 3(a) and 3(b) are repeated (see FIGS. 6(a) and 6(b)).

Then, a sidewall spacer 13 located between the polysilicon layer 7a and the polysilicon layer 5a is removed to expose the semiconductor substrate 1. Further, ion implantation is carried out under the same conditions as employed in the step shown in FIG. 3(c) to form impurity diffusion layers 2 and 3 and a floating impurity diffusion layer 17 in the surface layer of the semiconductor substrate (see FIG. 6(c)).

Thereafter, the manufacturing steps shown in FIGS. 4(a) to 4(d) are repeated to provide the nonvolatile semiconductor memory according to the present invention including the floating impurity diffusion layer 17 (see FIGS. 7(a) to 7(d)).

The same method of writing and reading as employed in Embodiment 1 is also applicable to the nonvolatile semiconductor memory according to Embodiment 2.

Embodiment 3

FIG. 8(a) is a schematic plan view illustrating an example of the nonvolatile semiconductor memory according to the present invention. FIGS. 8(b) to 8(d) are sectional views, among which FIG. 1(b) is cut along a plane X1-X1' (parallel to the channel direction (X direction)), FIG. 8(c) is cut along a plane Y1-Y1' (vertical to the channel direction (Y direction)) and FIG. 8(d) is cut along a plane Y2-Y2' (vertical to the channel direction).

In FIGS. 8(a) to 8(b), the memory cell of the nonvolatile semiconductor memory comprises a semiconductor substrate 1 of P-type silicon in which trenches 18 are formed and N$^+$-type impurity diffusion layers 2 and 3 formed on a sidewall of each of the trenches 18. SPGs 7 of polysilicon are buried in the trenches 18 with the intervention of a gate oxide film 6 of $SiO_2$. Floating gates 5 of polysilicon are formed on a flat surface of the semiconductor substrate 1 sandwiched between the trenches 18 with the intervention of a tunnel oxide film 4 and control gates 9 are formed on the floating gates with the intervention of a third insulating film of an ONO film 8.

The first, second and third insulating films may be an oxide film, a nitride film, or a layered structure of these films. The conductivity types of the semiconductor substrate and the impurity diffusion layer may be replaced. Further, the memory cell itself may be formed in a well.

The impurity diffusion layer 2 functions as a source in a cell and a drain in another cell adjacent to the cell. The tunnel oxide film may be 3–10 nm thick (e.g., 9 nm) and the gate oxide film may be 5–30 nm thick (e.g., 20 nm).

Next, a description will be made to an area of the memory cell with reference to FIG. 9.

As seen in FIG. 9, the size of the memory cell in the X direction is the sum of the length F of a portion where the floating gate is located and the length F of a portion where the buried SPG is located. That is, the size in the X direction is 2F.

The size of the memory cell in the Y direction is the sum of the length F of a portion where the floating gate and the control gate overlap with each other and the length F of a clearance isolating the memory cells. That is, the size of the memory cell in the Y direction is 2F.

Thus, the memory cell structure of the present invention realizes the actual minimum memory cell area of $4F^2$.

Hereinafter, the method of manufacturing the nonvolatile semiconductor memory according to the Embodiment 3 is described with reference to FIGS. 10(a) to 14.

First, a tunnel oxide film 4 is formed by thermal oxidization at 600–1100° C. on a semiconductor substrate 1 of a first conductivity type. Then, a polysilicon layer 5a of 10–200 nm thick (e.g., 50 nm), an oxide film 10 of 5–50 nm (e.g., 20 nm) and a nitride film 11 of 10–500 nm thick (e.g., 200 nm) are sequentially formed over the tunnel oxide film 4. Then, a resist mask 12 is formed to remove the nitride film 11, the polysilicon layer 5a and the oxide film 10 by etching (see FIG. 10(a)).

The tunnel oxide film 4 is etched away and the resist mask 12 is removed. Thereafter, oblique ion implantation of As, for example, is performed to form impurity diffusion layers 2a and 3a each overlapping with the polysilicon layer 5a at least at one side in the X direction (see FIG. 10(b)).

The oblique ion implantation is carried out with an accelerating voltage of 5–30 kev (e.g., 15 kev) and an implantation amount of $1\times10^{13}$ to $1\times10^{16}$ cm$^{-2}$ (e.g., $1\times10^{14}$ cm$^{-2}$).

Then, a thermal treatment is performed at 600–1100° C. (e.g., 800° C.) for re-crystallization of the implanted region. In this case, a layered film of the oxide film and the nitride film is used as the insulating film on the floating gate, but the nitride film may solely be used.

Using the nitride film 11 as a mask, the semiconductor substrate is etched to form a trench 18. Through this step, the impurity diffusion layers 2a and 3a remain only in regions overlapping with the gate (see FIG. 11(a)) and serve as the impurity diffusion layers 2 and 3, respectively.

The surface of the trench 18 is thermally oxidized to form a gate oxide film 6, and then a polysilicon layer 7a is deposited to bury the trench 18 (e.g., to a thickness of 100 nm). Thereafter, the surface is planarized by CMP (see FIG. 11(b)). At the formation of the gate oxide film 6, the sidewalls of the polysilicon layer 5a are also oxidized and formed into insulating portions 6a. The insulating portions 6a prevent leak current between the floating gate and the SPG.

Figure 12A:
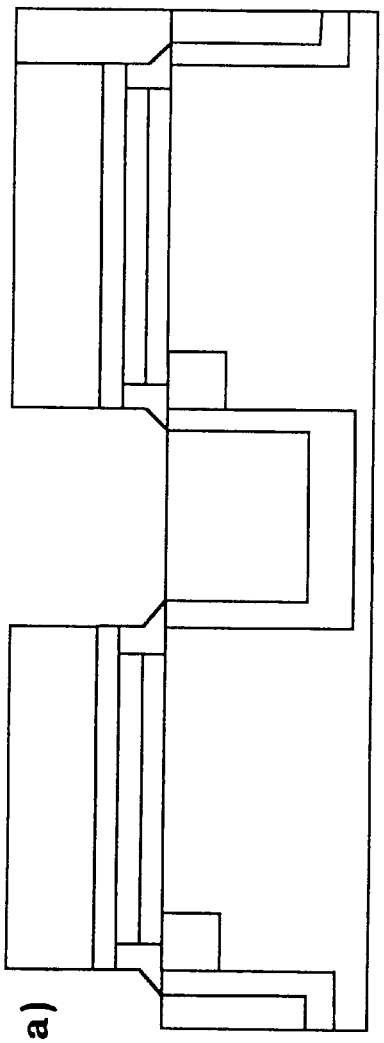
FIGS. 12(a) and 12(b) are schematic sectional views illustrating the manufacturing steps of the memory cell according to Embodiment 3.
Figure 12B:
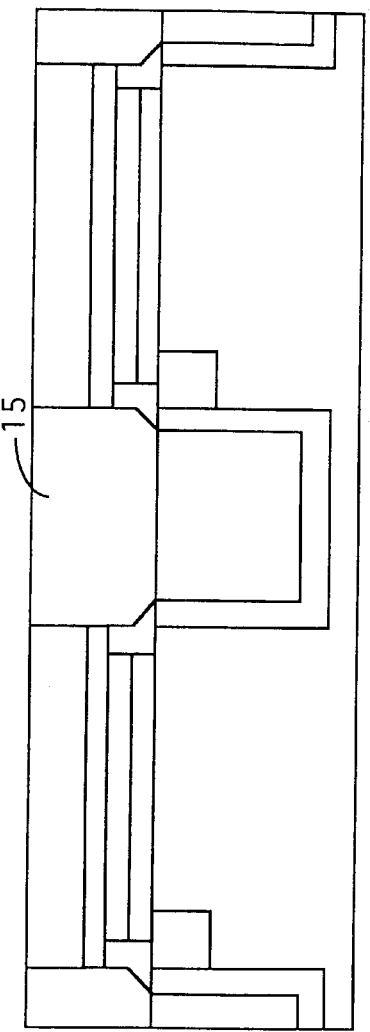

Then, the polysilicon layer 7a buried in the trench 18 is etched back so that the level of the remaining polysilicon layer 7a will preferably be equal to or higher than that of the semiconductor substrate 1 (see FIG. 12(a)).

Next, the surface of the SPG is thermally oxidized at 600–1100° C. (e.g., 800° C.) and a HDP oxide film (insulating film) 15 is deposited. Then the oxide film on the floating gate is removed by CMP or etch back (see FIG. 12(b)). In this step, the nitride film 11 serves as an etch stopper. Wet etching is also applicable in place of CMP and etch back.

The nitride film 11 is removed with hot phosphoric acid or by chemical dry etching and then the oxide film 10 on the floating gate 5 is removed by light dipping into a HF solution. In this step, since the etching rate of the insulating film 15 is greater than that of the thermally oxidized film and the like, the edges of the remaining insulating film 15 are tapered (see FIG. 13(a)). The thus tapered shape facilitates the fabrication of the control gate and the floating gate in a later step.

Subsequently, a polysilicon layer 5b of 10–200 nm thick (e.g., 50 nm) is deposited and patterned using a resist mask 16 (see FIG. 13(b)). This step is performed to increase an overlapping area between the floating gate and the control gate. As a result, the gate capacitance coupling ratio increases and voltage consumption is lowered. This embodiment employs the polysilicon layer 5b for the above reason, but it may be omitted.

Then, the resist mask 16 is removed. A third insulating film of an ONO film 8 and a polysilicon layer 9a are deposited. Then, patterning for forming word lines is performed to sequentially etch the polysilicon layers 5a and 5b and 9a and the ONO layer 8, thereby forming a floating gate and a control gate in self-alignment (see FIG. 14). Finally, a protective film such as BPSG is deposited (not shown).

Through these steps, the nonvolatile semiconductor memory of the present invention is completed.

The method of writing and reading as employed in Embodiment 1 is also applicable to the nonvolatile semiconductor memory according to Embodiment 3.

Embodiment 4

Figure 14:
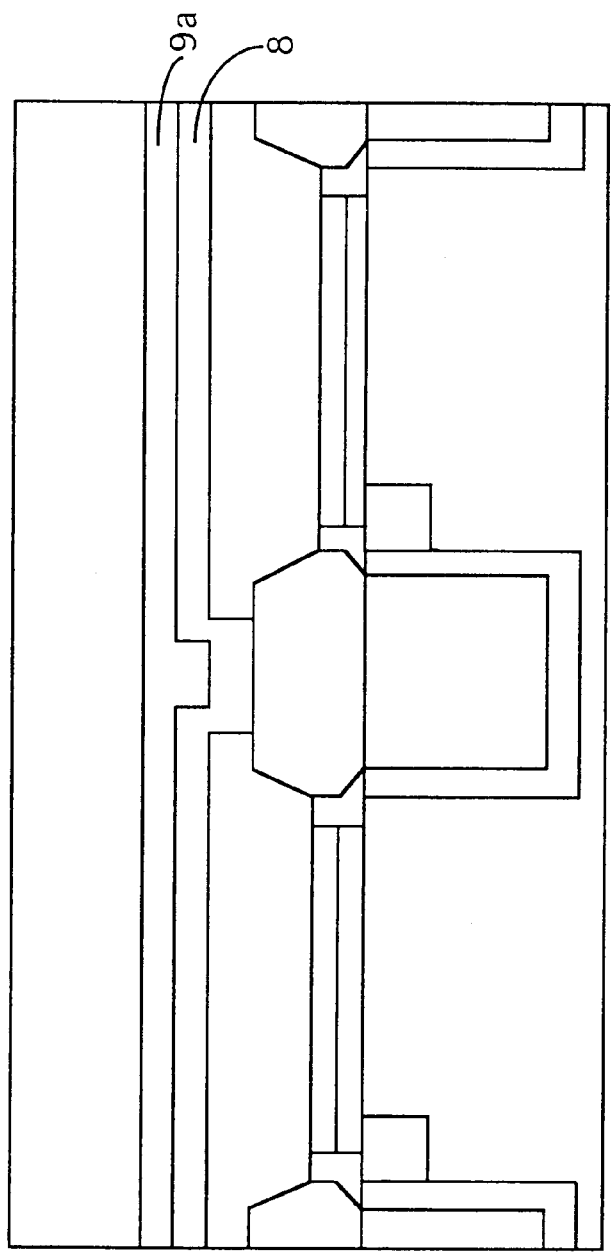
FIG. 14 is a schematic sectional view illustrating the manufacturing steps of the memory cell according to Embodiment 3.

With increased overlapping area between the floating gate and the control gate, the gate capacitance coupling ratio increases and therefore voltage consumption is lowered. Accordingly, in Embodiments 1 to 3, the polysilicon layer 5b is layered on the polysilicon layer 5a as shown in FIG. 14. However, in such manufacturing methods, the polysilicon layer 5b may possibly cause misalignment with the polysilicon layer 5a. Therefore, photolithography under a sub rule (with a resist mask having openings smaller than F) is employed to achieve the memory cell area of $4F^2$.

Embodiment 4 of the present invention provides a manufacture method which realizes the memory cell area of $4F^2$ without utilizing the sub rule.

First, the manufacturing steps of Embodiment 3 as illustrated in FIGS. 10(a) to 13(a) are repeated.

Figure 15A:
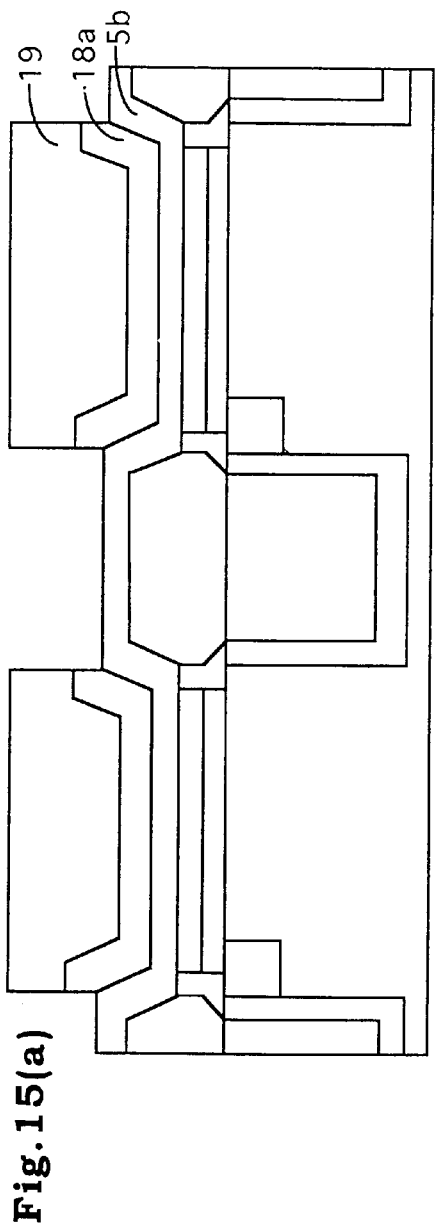
FIGS. 15(a) and 15(b) are schematic sectional views illustrating the manufacturing steps of the memory cell according to Embodiment 4.

Then, a polysilicon layer 5b is deposited and a nitride film 18a is deposited thereon. The nitride film 18a is patterned using a resist mask 19 which is formed without depending on the sub rule (see FIG. 15(a)).

Figure 15B:
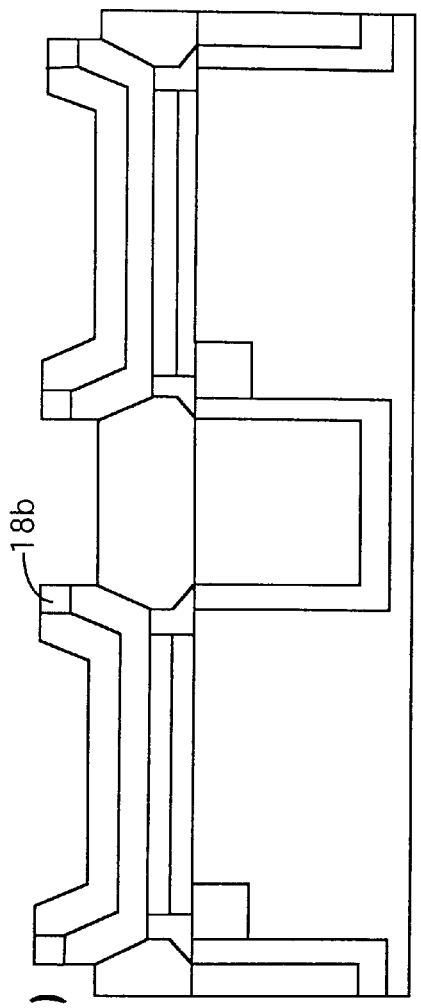

The resist mask 19 is removed, a nitride film is further deposited and etched back to form spacers 18b on the sidewalls of the nitride film 18a. The spacers 18b prevent the misalignment. Then, the polysilicon layer 5b is patterned using the nitride film 18a and the spacers 18b as a mask (see FIG. 15(b)).

In the same manner as shown in FIG. 14, a polysilicon layer 9a is deposited and patterning for forming the word lines is performed to sequentially etch the polysilicon layers 5a, 5b and 9a, the nitride film 18a and the spacer 18b. Thus, a floating gate and a control gate are formed in self-alignment.

Finally, a protective film such as BPSG is deposited (not shown).

Through these steps, the nonvolatile semiconductor memory of the present invention is completed.

The method of writing and reading employed in Embodiment 1 is also applicable to the nonvolatile semiconductor memory according to Embodiment 4.

Embodiment 5

Similarly to Embodiment 4, Embodiment 5 provides a manufacturing method which achieves the memory cell area of $4F^2$ without utilizing the sub rule.

Figure 16A:
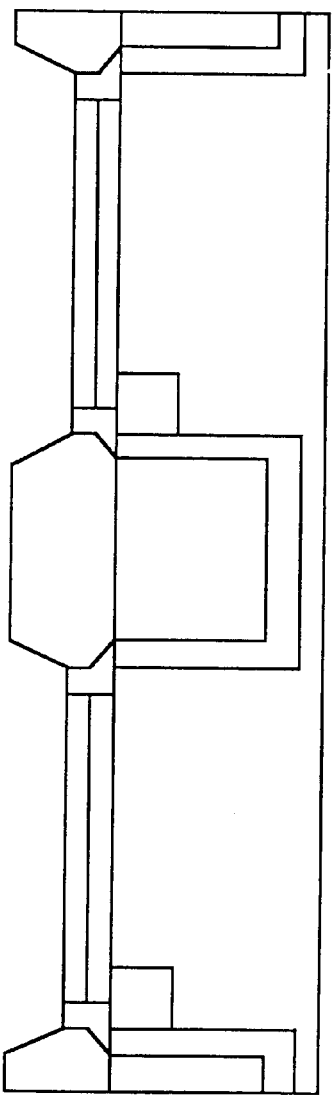
FIGS. 16(a) and 16(b) are schematic sectional views illustrating the manufacturing steps of the memory cell according to Embodiment 5.

First, the manufacturing steps of Embodiment 3 as illustrated in FIGS. 10(a) to 13(a) are repeated (see FIG. 16(a)).

Figure 16B:
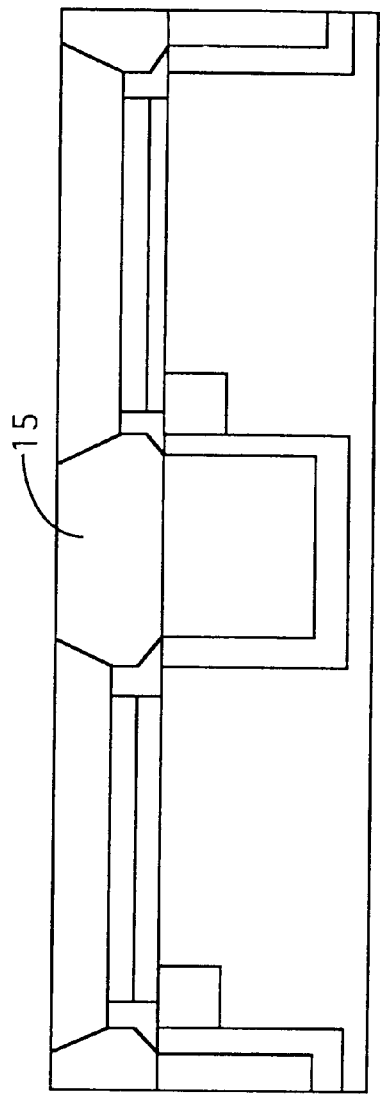

Then, a polysilicon layer 5b is deposited and planarization is performed by CMP until the insulating film 15 is exposed. Thus, a layered floating gate structure is formed in self-alignment (see FIG. 16(b)).

Then, in the same manner as shown in FIG. 14, an ONO film 8 and a polysilicon layer 9a are deposited and patterning for forming the word lines is performed to sequentially etch the polysilicon layers 5a, 5b and 9a and the ONO film 8. Thus, a floating gate and a control gate are formed in self-alignment.

Finally, a protective film such as BPSG is deposited (not shown).

Through these steps, the nonvolatile semiconductor memory of the present invention is completed.

The method of writing and reading employed in Embodiment 1 is also applicable to the nonvolatile semiconductor memory according to Embodiment 5.

Embodiment 6

In the above Embodiments 1 to 5, the impurity diffusion layer is provided to overlap with the floating gate only. Increase in resistance of the impurity diffusion layer causes increase in array noise due to CR (return) delay and substrate bias effect during data reading. Therefore, the reduction of the resistance of the impurity diffusion layer has been demanded. Hereinafter, description is made to a method for manufacturing a structure which allows the reduction of the resistance of the impurity diffusion layer.

First, the manufacturing steps of Embodiment 3 as shown in FIGS. 10(a) and 10(b) are repeated.

Figure 17:
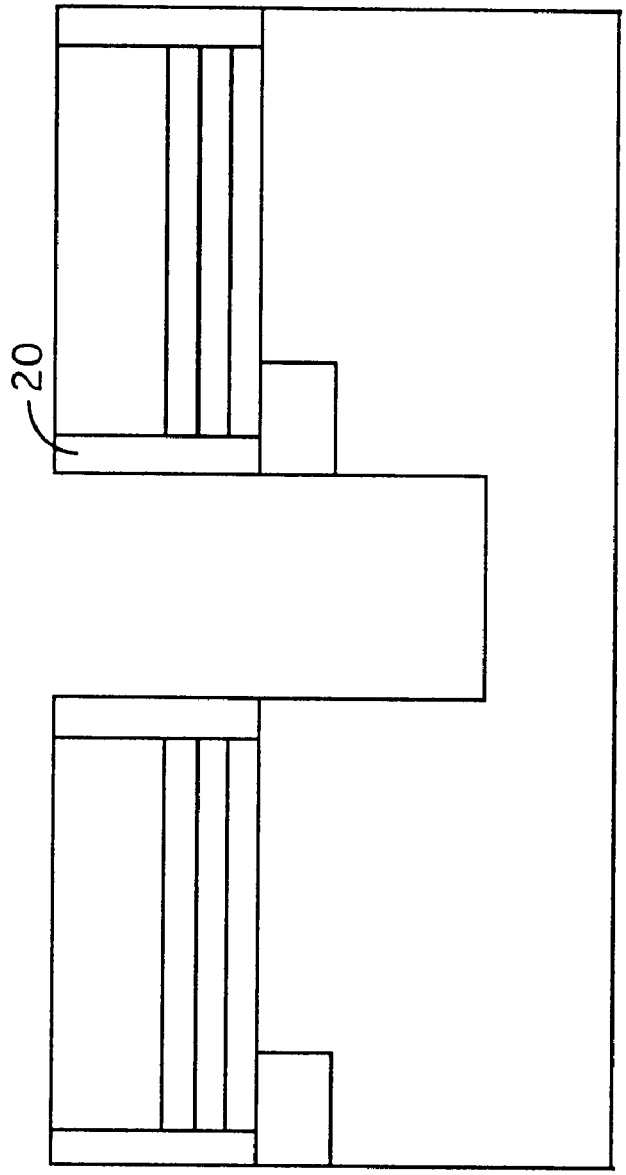
FIG. 17 is a schematic sectional view illustrating the manufacturing steps of the memory cell according to Embodiment 6.

After the resist mask 12 is removed, a silicon oxide film is deposited by CVD and etched back to form sidewall spacers 20 on the sidewalls of the layered structure along the channel direction. Using the polysilicon layer 5a and the sidewall spacers 20 as a mask, a trench is formed in self-alignment (see FIG. 17). Since the sidewall spacers 20 are provided, the widths of the impurity diffusion layers 2 and 3 become greater than those of Embodiment 3. As a result, the resistance of the impurity diffusion layer is reduced.

Thereafter, the manufacturing steps of Embodiment 3 are repeated to provide a nonvolatile semiconductor memory of the present invention in which the memory cell area of $4F^2$ is realized.

The method of writing and reading employed in Embodiment 1 is also applicable to the nonvolatile semiconductor memory according to Embodiment 6.

Embodiment 7

Embodiment 7 is a variety of Embodiment 6 described above.

First, the manufacturing steps of Embodiment 3 as shown in FIG. 10(a) are repeated.

After the resist mask 12 is removed, ion implantation of As, for example, is performed to form an impurity diffusion layer between the floating gates. The ion implantation is performed with an accelerating voltage of 5–30 kev (e.g., 15 kev) and an implantation amount of $1\times10^{13}$ to $1\times10^{16}$ cm$^{-2}$ (e.g., $1\times10^{14}$ cm$^{-2}$). Then, annealing is performed at 600–1100° C. (e.g., 800° C.).

A thermal oxidation at 600–1100° C. (e.g., 800° C.) is then carried out to form sidewall spacers on the sidewalls of the layered structure on the substrate in the channel direction. Using the layered structure and the sidewall spacers as a mask, the trench is formed in self-alignment. Simultaneously, the impurity diffusion layers which serve as the source and the drain, respectively, are formed.

Thereafter, the manufacturing steps of Embodiment 3 are repeated to complete the nonvolatile semiconductor memory of the present invention in which the memory cell area of $4F^2$ is realized.

The method of writing and reading employed in Embodiment 1 is also applicable to the nonvolatile semiconductor memory according to Embodiment 7.

Embodiment 8

Embodiment 8 provides a nonvolatile semiconductor memory provided with a SPG formed in the trench and a floating impurity diffusion layer, realizing the memory cell of $4F^2$.

The method of manufacturing the nonvolatile semiconductor memory according to Embodiment 8 is explained with reference to FIGS. 18(a) to 21(b).

First, a tunnel oxide film 4 is formed by thermal oxidation on a semiconductor substrate 1 of a first conductivity type. Then, a polysilicon layer 5a of 10–200 nm thick (e.g., 50 nm), an oxide film 10 of 5–50 nm thick (e.g., 20 nm) and a nitride film 11 of 10–500 nm thick (e.g., 200 nm) are sequentially formed over the tunnel oxide film 4. After a resist mask 12 is formed, the nitride film 11, the polysilicon layer 5a and the oxide film 11 are etched away (see FIG. 18(a)).

Figure 18A:
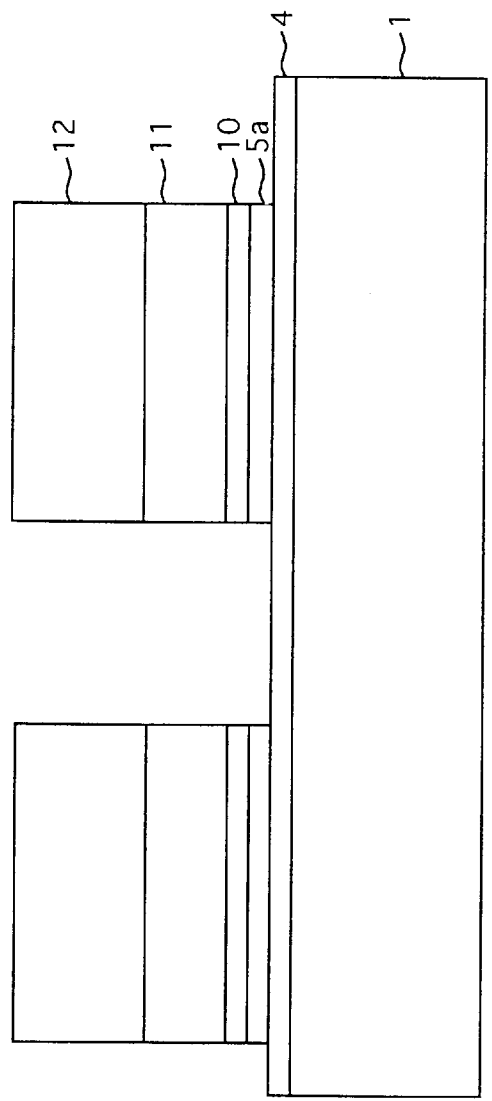
FIGS. 18(a) and 18(b) are schematic sectional views illustrating the manufacturing steps of the memory cell according to Embodiment 8.
Figure 18B:
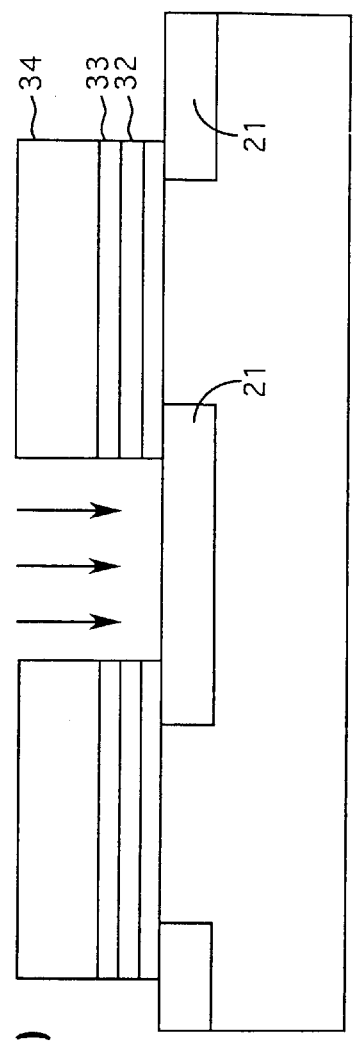
Figure 19A:
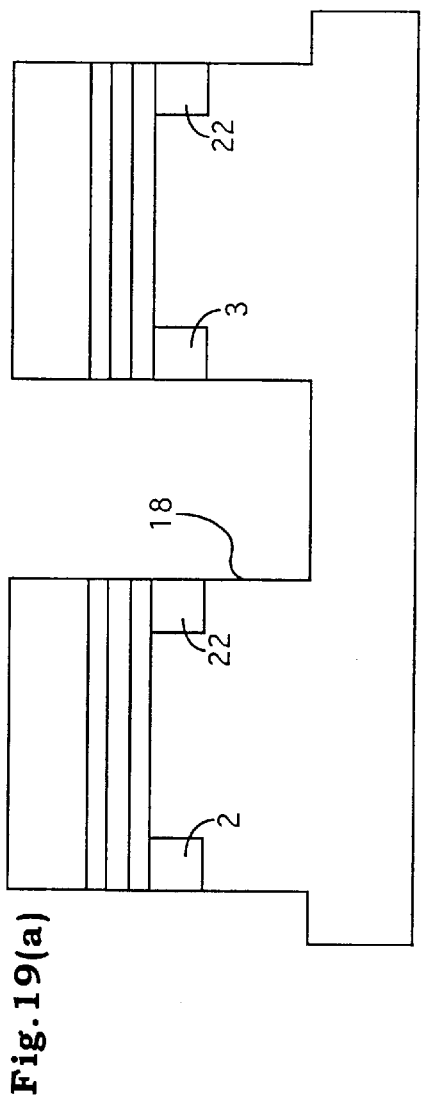
FIGS. 19(a) and 19(b) are schematic sectional views illustrating the manufacturing steps of the memory cell according to Embodiment 8.
Figure 19B:
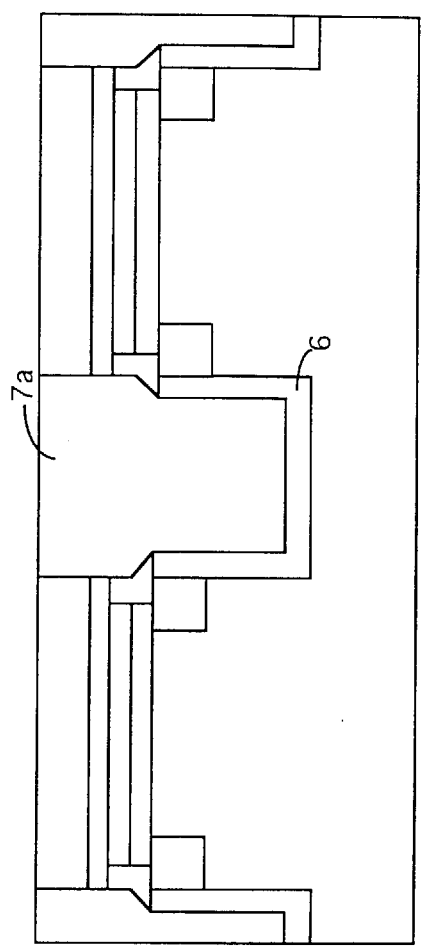

After the tunnel oxide film 4 is etched away and the resist mask 12 is removed, ion implantation of As, for example, is performed vertically to the semiconductor substrate 1 to form an impurity diffusion layer 21 in a surface layer of the exposed semiconductor substrate (see FIG. 18(b)). The impurity diffusion layer 21 extends in the surface layer of the semiconductor substrate to contact the edges of the tunnel oxide film 4.

The ion implantation is carried out under an accelerating voltage of 5–30 kev (e.g., 15 kev) and an implantation amount of $1\times10^{13}$ to $1\times10^{16}$ cm$^{-2}$ (e.g., $1\times10^{14}$ cm$^{-2}$).

Then, a thermal treatment is performed at 600–1100° C. (e.g., 800° C.) for re-crystallization of the implanted region. In this case, a layered structure of the oxide film and the nitride film is used as an insulating film on the floating gate, the nitride film may solely be used.

Using the nitride film 11 as a mask, the semiconductor substrate is etched to form a trench 18. Through this step, the impurity diffusion layer 21 remains only in portions overlapping with the gate and formed into impurity diffusion layers 2 and 3 and a floating impurity layer 22 (see FIG. 19(a)).

The surface of the trench 18 is thermally oxidized to form a gate oxide film 6. A polysilicon layer 7a is deposited to fill the trench 18 (e.g., to a thickness of 100 nm) and then planarization is performed by CMP (see FIG. 19(b)).

Then, the polysilicon layer 7a buried in the trench 18 is etched back so that the level of the remaining polysilicon layer 7a will preferably be equal to or higher than that of the semiconductor substrate 1 (see FIG. 20(a)).

The surface of the SPG is thermally oxidized at 600–1100° C. (e.g., 800° C.) and a HDP oxide film (insulating film) 15 is deposited. The oxide film on the polysilicon layer 5a is then removed by CMP or etch back. In this step, the nitride film 11 functions as an etch stopper. The removal of the oxide film may be performed by wet etch in place of CMP and etch back (see FIG. 20(b)).

Then, the nitride film 11 is removed with hot phosphoric acid or by chemical dry etching and then the oxide film 10 on the polysilicon layer 5a is removed by light dipping into a HF solution. In this step, since the etching rate of the insulating film 15 is greater than that of the thermally oxidized film, the edges of the remaining insulating film 15 is tapered (see FIG. 21(a)). The thus tapered shape facilitates the fabrication of the control gate and the floating gate in a later step.

Figure 21A:
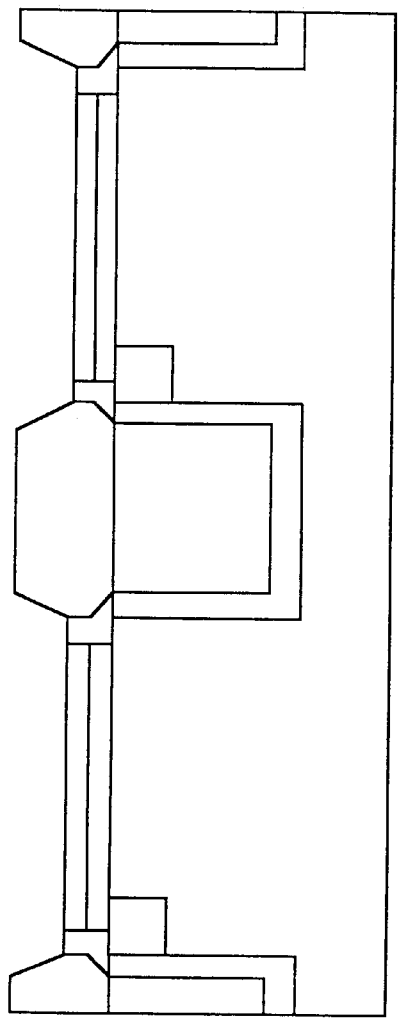
FIGS. 21(a) and 21(b) are schematic sectional views illustrating the manufacturing steps of the memory cell according to Embodiment 8.
Figure 21B:
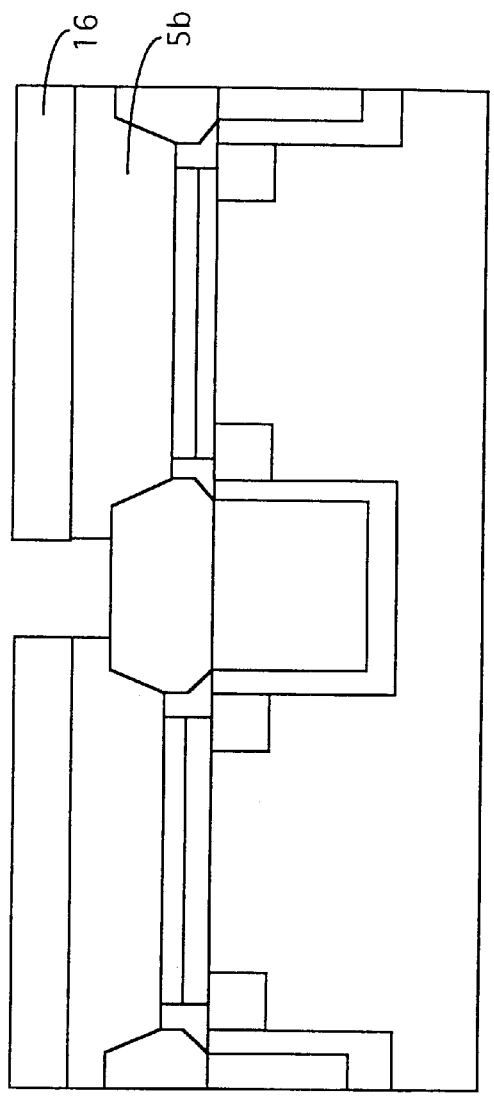
Figure 22:
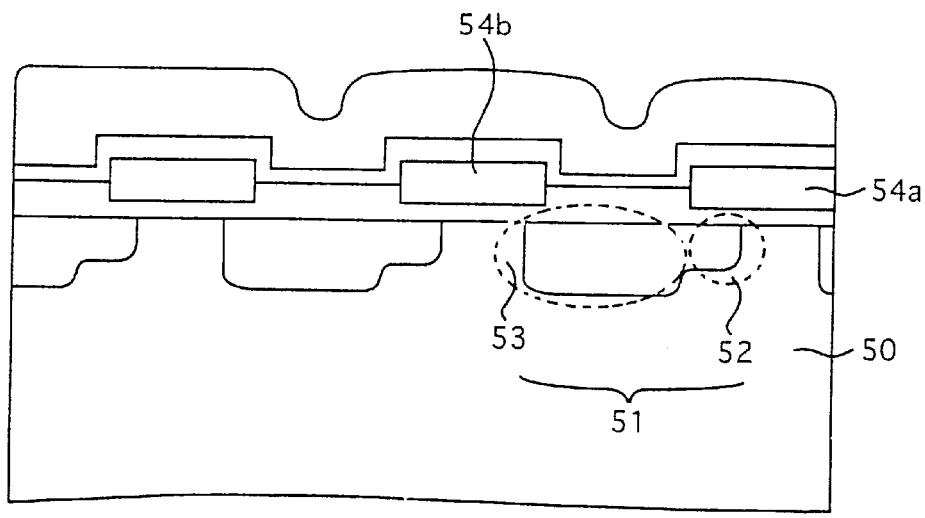
FIG. 22 is a schematic sectional view illustrating a memory cell of a nonvolatile semiconductor memory according to the prior art.
Figure 23:
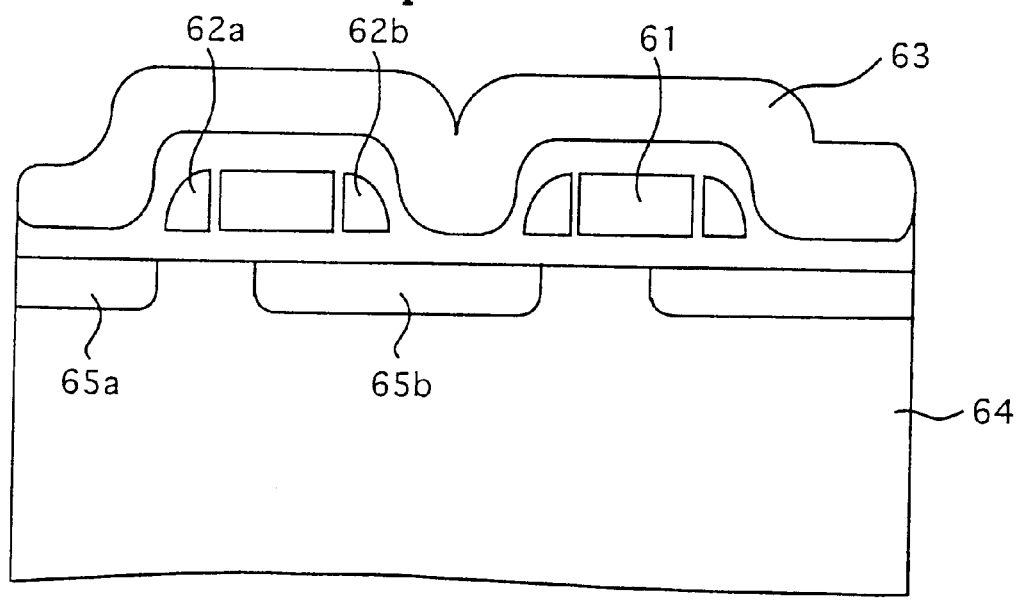
FIG. 23 is a schematic sectional view illustrating a memory cell of a nonvolatile semiconductor memory according to the prior art.
Figures 24A, 24B, 24C:
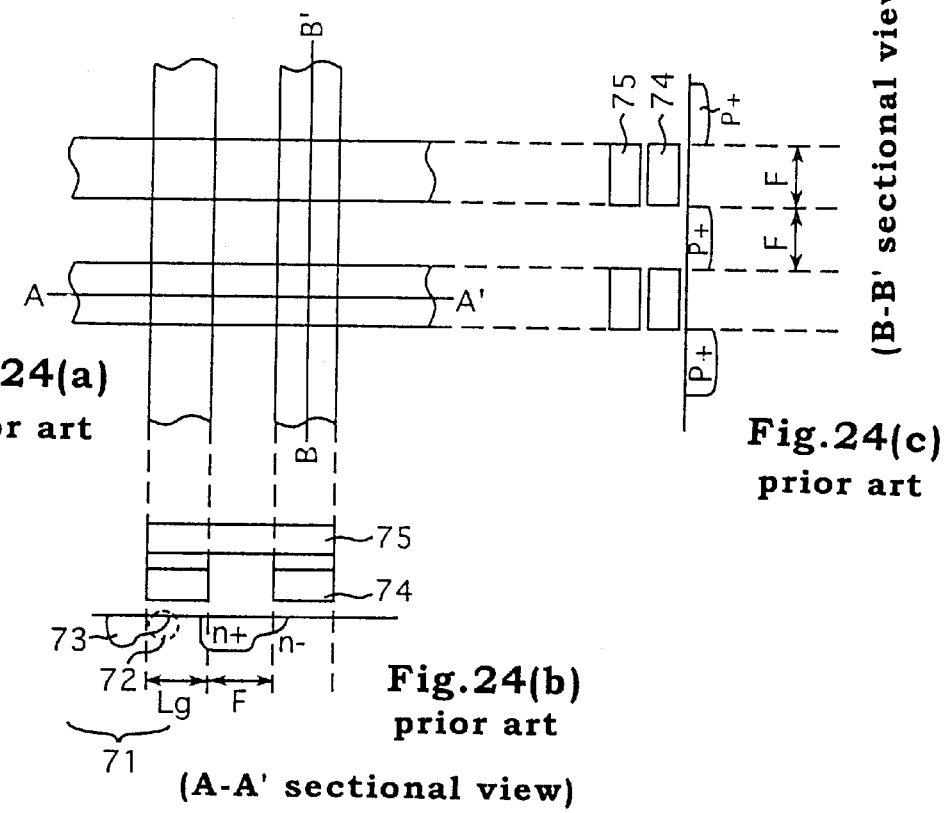
FIG. 24(a) is a schematic plan view and FIGS. 24(b) and 24(c) are sectional views of a memory cell of a nonvolatile semiconductor memory according to the prior art.

Subsequently, a polysilicon layer 5b of 10–200 nm thick (e.g., 50 nm) is deposited and patterned using a resist mask 16 (see FIG. 21(b)). This step is performed to increase an overlapping area between the floating gate and the control gate. As a result, the gate capacitance coupling ratio increases and voltage consumption is lowered. This embodiment employs the polysilicon layer 5b for the above reason, but it may be omitted.

Thereafter, the floating gate 5 and the control gate 9 are formed in the same manner as shown in FIG. 14.

Through these steps, the nonvolatile semiconductor memory of the present invention is completed.

The method of writing and reading as employed in Embodiment 1 is also applicable to the nonvolatile semiconductor memory according to Embodiment 8.

According to the present invention, data rewriting is performed by making use of the FN tunnel current or the CHE so that a highly reliable nonvolatile semiconductor memory capable of high-speed data writing is provided. Further, the memory cell area of $4F^2$, which is the actual minimum value, is realized by burying the SPG transistors in the trenches in a device of virtual grounding structure utilizing the SPG cells.

What is claimed is:

1. A nonvolatile semiconductor memory including at least two cells each comprising:
    a floating gate formed on a semiconductor substrate with the intervention of a first insulating film;
    a split gate formed on the semiconductor substrate with the intervention of a second insulating film at a predetermined distance laterally spaced from the floating gate;
    a control gate formed at least partially over at least a portion of the floating gate with the intervention of a third insulating film, the control gate also being provided at least partially over at least a portion of the split gate with no part of the control gate being located directly between the floating gate split gate; and
    an impurity diffusion layer formed in a surface layer of the semiconductor substrate and capacitively coupled with an edge of the floating gate on an opposite side to the split gate in the channel direction,
    wherein the floating gate and the split gate of one cell are alternately arranged with the floating gate and the split gate of another adjacent cell along the channel direction and the impurity diffusion layer of one cell is capacitively coupled with a split gate of another adjacent cell, so that the floating gate and the slit gate of the one cell are adjacent one another and the floating gate of the one cell is also adjacent to the split gate of the another adjacent cell.

2. A nonvolatile semiconductor memory according to claim 1, wherein the split gate of one cell is formed in self-alignment at a predetermined distance from the floating gate.

3. A nonvolatile semiconductor memory according to claim 1, wherein the impurity diffusion layer of one cell is capacitively coupled with the floating gate of said one cell but is not with the split gate of said one cell.

4. A nonvolatile semiconductor memory according to claim 1, wherein the split gate is formed in a trench with the intervention of the second insulating film, the trench being formed in the semiconductor substrate between the floating gates adjacent to each other.

5. A nonvolatile semiconductor memory according to claim 4, wherein the impurity diffusion layer of one cell extends from the surface of the semiconductor substrate along a sidewall of the trench and is disposed adjacent to the split gate.

6. A nonvolatile semiconductor memory according to claim 1, wherein sidewall spacers are formed on sidewalls of the floating gates of one cell and another adjacent cell, the trench is formed between the sidewall spacers of one cell and another adjacent cell and the impurity diffusion layer is formed in the surface layer of the semiconductor substrate below each of the sidewall spacers.

7. A nonvolatile semiconductor memory according to claim 1, wherein a plurality of cells are formed along a channel direction and the impurity diffusion layer of one cell functions as a drain of said one cell and a source of another adjacent cell.

8. A nonvolatile semiconductor memory according to claim 1, wherein a plurality of cells are formed along the channel direction and control gates of said plurality of cells are constructed of a single control gate.

9. A nonvolatile semiconductor memory according to claim 1, wherein a plurality of cells are formed along a Y direction orthogonal to the channel direction and said plurality of cells are electrically connected through a single impurity diffusion layer.

10. A nonvolatile semiconductor memory according to claim 1, wherein a plurality of cells are formed along the Y direction orthogonal to the channel direction and said plurality of cells are electrically connected through a single split gate.

11. A nonvolatile semiconductor memory according to claim 1, wherein a floating impurity diffusion layer is formed in the surface layer of the semiconductor substrate between the floating gate and the split gate of one cell.

12. A nonvolatile semiconductor memory according to claim 11, wherein an impurity diffusion layer of one cell functions as a drain, the impurity diffusion layer of another adjacent cell functions as a source of said one cell, and the floating impurity diffusion layer of said one cell functions as an extension of the drain of said one cell at the data writing to said one cell.

13. A nonvolatile semiconductor memory according to claim 11, wherein the impurity diffusion layer of one cell functions as a drain, an impurity diffusion layer of another adjacent cell functions as a source of said one cell, and the floating impurity diffusion layer of said one cell functions as an extension of the source of said one cell at the data reading from said one cell.

14. A method of reading data from the nonvolatile semiconductor memory of claim 1, wherein the data reading from one cell is performed by grounding the impurity diffusion layer of said one cell and applying a voltage to an impurity diffusion layer of another adjacent cell, or by applying a voltage to the impurity diffusion layer of said one cell and grounding the impurity diffusion layer of said another adjacent cell.

15. A method of reading data from the nonvolatile semiconductor memory of claim 1, wherein the data reading from one cell is performed by applying a voltage to the split gate of said one cell and grounding application to a split gate of another adjacent cell to isolate said one cell from said another adjacent cell.

16. A method of writing data to the nonvolatile semiconductor memory of claim 1, wherein the data writing is performed by utilizing FN tunnel current flowing between the floating gate and the semiconductor substrate or the floating gate and the impurity diffusion layer of one cell.

17. A method of erasing data from the nonvolatile semiconductor memory, wherein, after the data writing by the method of claim 16, the data is erased by utilizing the FN tunnel current flowing between the floating gate and the semiconductor substrate or the floating gate and the impurity diffusion layer of a selected desired cell.

18. A method of writing data to the nonvolatile semiconductor memory according to claim 1, wherein the data writing to one cell is performed by applying a predetermined voltage to the impurity diffusion layer of said one cell and grounding an impurity diffusion layer of another cell to flow electric current, and applying a first voltage to the split gate to weakly invert a channel region facing the split gate to inject hot electrons from an edge of the split gate.

19. A method of erasing data from the nonvolatile semiconductor memory, wherein, after the data writing by the method of claim 18, the data is erased by utilizing the FN tunnel current flowing between the floating gate and the semiconductor substrate or the floating gate and the impurity diffusion layer of a selected desired cell.

20. A method of data writing to the nonvolatile semiconductor memory according to claim 1, wherein the data writing to one cell is performed by applying a predetermined voltage to the impurity diffusion layer of said one cell and grounding an impurity diffusion layer of another cell to flow electric current, and applying a second voltage to the split gate to strongly invert a channel region facing the split gate to inject hot electrons from the impurity diffusion layer of said one cell.

21. A method of erasing data from the nonvolatile semiconductor memory, wherein, after the data writing by the method of claim 20, the data is erased by utilizing the FN tunnel current flowing between the floating gate and the semiconductor substrate or the floating gate and the impurity diffusion layer of a selected desired cell.

22. The nonvolatile semiconductor memory of claim 1, wherein the split gate extends in a direction perpendicular to the channel direction, and the control gate extends in the channel direction.

23. A nonvolatile semiconductor memory comprising:
   a floating gate of a first cell formed on a semiconductor substrate with the intervention of at least a first insulating film;
   a split gate of the first cell formed on the semiconductor substrate laterally spaced from the floating gate of the first cell, wherein no part of the split gate of the first cell is located over the floating gate of the first cell;
   a control gate formed at least partially over at least portions of at least one of the floating gate and the split gate of the first cell with no part of the control gate being located directly between the floating gate and split gate of the first cell;
   an impurity diffusion layer formed in a surface layer of the semiconductor substrate and capacitively coupled with at least an edge of the floating gate of the first cell; and
   wherein the floating gate of the first cell is adjacent a split gate of a second cell, and the split gate of the first cell is adjacent a floating gate of a third cell, and the impurity diffusion layer of first cell is capacitively coupled with the split gate of the second cell.

24. The nonvolatile semiconductor memory of claim 23, wherein the split gate of the first cell extends in a direction perpendicular to a channel lengthwise direction, and the control gate extends in the channel lengthwise direction.

25. The memory of claim 23, wherein the control gate is formed at least partially over at least portions of both the floating gate and the split gate of the first cell.

26. A nonvolatile semiconductor memory according to claim 23, wherein the split gate of the first cell is formed in self-alignment at a predetermined distance from the floating gate.

27. A nonvolatile semiconductor memory according to claim 23, wherein the impurity diffusion layer of the first cell is capacitively coupled with the floating gate of said first cell but not with the split gate of said first cell.

28. A nonvolatile semiconductor memory according to claim 23, wherein the split gate of the first cell is formed in a trench with the intervention of the second insulating film, the trench being formed in the semiconductor substrate between floating gates adjacent to each other.

29. A nonvolatile semiconductor memory according to claim 28, wherein the impurity diffusion layer of the first cell extends from the surface of the semiconductor substrate along a sidewall of the trench and is disposed adjacent to the split gate of the first cell.

30. A nonvolatile semiconductor memory according to claim 23, wherein sidewall spacers are formed on sidewalls of the floating gates of the first cell and another adjacent cell, a trench is formed between the sidewall spacers of the first cell and the adjacent cell and the impurity diffusion layer is formed in the surface layer of the semiconductor substrate below each of the sidewall spacers.

31. A nonvolatile semiconductor memory according to claim 23, wherein a plurality of cells are formed along a channel direction and the impurity diffusion layer of one cell functions as a drain of said one cell and a source of another adjacent cell.

32. A nonvolatile semiconductor memory according to claim 23, wherein control gates of the first, second and third cells are constructed of a single control electrode or control gate.

33. A nonvolatile semiconductor memory according to claim 23, wherein a plurality of cells are formed along a Y direction orthogonal to the channel direction and said plurality of cells are electrically connected through a single impurity diffusion layer.

34. A nonvolatile semiconductor memory according to claim 23, wherein a plurality of cells are formed along the Y direction orthogonal to the channel direction and said plurality of cells are electrically connected through a single split gate.

35. A nonvolatile semiconductor memory according to claim 23, wherein a floating impurity diffusion layer is formed in the surface layer of the semiconductor substrate between the floating gate and the split gate of the first cell.

36. A nonvolatile semiconductor memory according to claim 35, wherein the impurity diffusion layer of the first cell functions as a drain, an impurity diffusion layer of another adjacent cell functions as a source of said first cell, and the floating impurity diffusion layer of said first cell functions as an extension of the drain of said first cell at the data writing to said first cell.

37. A nonvolatile semiconductor memory according to claim 35, wherein the impurity diffusion layer of the first cell functions as a drain, an impurity diffusion layer of an adjacent cell functions as a source of said first cell, and the floating impurity diffusion layer of said first cell functions as an extension of the source of said first cell at the data reading from said first cell.

38. A method of reading data from the nonvolatile semiconductor memory of claim 23, wherein the data reading from the first cell is performed by grounding the impurity diffusion layer of said first cell and applying a voltage to an impurity diffusion layer of an adjacent cell, or by applying a voltage to the impurity diffusion layer of said first cell and grounding the impurity diffusion layer of said adjacent cell.

39. A method of reading data from the nonvolatile semiconductor memory of claim 23, wherein the data reading from the first cell is performed by applying a voltage to the split gate of said first cell and grounding application to a split gate of an adjacent cell to isolate said first cell from said adjacent cell.

40. A method of writing data to the nonvolatile semiconductor memory of claim 23, wherein the data writing is performed by utilizing FN tunnel current flowing between the floating gate and the semiconductor substrate or the floating gate and the impurity diffusion layer of the first cell.

41. A method of erasing data from the nonvolatile semiconductor memory, wherein, after the data writing by the method of claim 40, the data is erased by utilizing the FN tunnel current flowing between the floating gate and the semiconductor substrate or the floating gate and the impurity diffusion layer of a selected desired cell.

42. A method of writing data to the nonvolatile semiconductor memory according to claim 23, wherein the data writing to the first cell is performed by applying a predetermined voltage to the impurity diffusion layer of said first cell and grounding an impurity diffusion layer of another cell to flow electric current, and applying a first voltage to the split gate to invert a channel region facing the split gate to inject hot electrons from an edge of the split gate.

43. A method of erasing data from the nonvolatile semiconductor memory, wherein, after the data writing by the method of claim 42, the data is erased by utilizing the FN tunnel current flowing between the floating gate and the semiconductor substrate or the floating gate and the impurity diffusion layer of a selected desired cell.

44. A method of data writing to the nonvolatile semiconductor memory according to claim 23, wherein the data writing to the first cell is performed by applying a predetermined voltage to the impurity diffusion layer of said first cell and grounding an impurity diffusion layer of another cell to flow electric current, and applying a second voltage to the split gate to strongly invert a channel region facing the split gate to inject hot electrons from the impurity diffusion layer of said first cell.

45. A method of erasing data from the nonvolatile semiconductor memory, wherein, after the data writing by the method of claim 44, the data is erased by utilizing the FN tunnel current flowing between the floating gate and the semiconductor substrate or the floating gate and the impurity diffusion layer of a selected desired cell.

* * * * *